United States Patent
Ibe et al.

(10) Patent No.: US 8,252,378 B2
(45) Date of Patent: Aug. 28, 2012

(54) FILM FORMATION METHOD, AND METHOD FOR MANUFACTURING LIGHT-EMITTING DEVICE

(75) Inventors: Takahiro Ibe, Kanagawa (JP); Hisao Ikeda, Kanagawa (JP)

(73) Assignee: Semiconductor Energy Laboratory Co., Ltd. (JP)

(*) Notice: Subject to any disclaimer, the term of this patent is extended or adjusted under 35 U.S.C. 154(b) by 1119 days.

(21) Appl. No.: 12/046,612

(22) Filed: Mar. 12, 2008

(65) Prior Publication Data

US 2008/0233272 A1    Sep. 25, 2008

(30) Foreign Application Priority Data

Mar. 22, 2007   (JP) .................... 2007-075375

(51) Int. Cl.
*B05D 5/06* (2006.01)
*B05D 5/12* (2006.01)
*C23C 16/00* (2006.01)

(52) U.S. Cl. .... 427/255.6; 427/64; 427/69; 427/255.14; 427/593

(58) Field of Classification Search ............... 427/255.6, 427/593

See application file for complete search history.

(56) References Cited

U.S. PATENT DOCUMENTS

| | | | | |
|---|---|---|---|---|
| 4,264,803 A * | 4/1981 | Shinko | ........................ | 392/389 |
| 5,904,961 A | 5/1999 | Tang et al. | | |
| 6,165,543 A | 12/2000 | Otsuki et al. | | |
| 6,283,060 B1 | 9/2001 | Yamazaki et al. | | |
| 6,420,057 B1 * | 7/2002 | Ueda et al. | ..................... | 428/690 |
| 6,689,492 B1 | 2/2004 | Yamazaki et al. | | |
| 6,703,179 B2 | 3/2004 | Tyan | | |
| 2004/0065902 A1 | 4/2004 | Yamazaki et al. | | |
| 2005/0005848 A1 | 1/2005 | Yamazaki et al. | | |
| 2006/0204783 A1 * | 9/2006 | Conley et al. | ................. | 428/690 |

FOREIGN PATENT DOCUMENTS

| | | |
|---|---|---|
| JP | 10-245547 | 9/1998 |
| JP | 2000-77182 | 3/2000 |
| JP | 2002-302759 | 10/2002 |
| JP | 2003-308974 | 10/2003 |

* cited by examiner

*Primary Examiner* — Christina Johnson
*Assistant Examiner* — Benjamin Schiffman
(74) *Attorney, Agent, or Firm* — Husch Blackwell LLP

(57) ABSTRACT

To improve the use efficiency of a vapor-deposition material, reduce the manufacturing cost of a light-emitting device including a layer containing an organic compound, and shorten the manufacturing time for manufacturing a light-emitting device. Inside of a film formation chamber is made in a reduced pressure state, and conductive-surface substrate is energized, so that the conductive-surface substrate is heated rapidly, and a material layer over the conductive-surface substrate is evaporated in a short period of time to be vapor-deposited on a film formation substrate, whereby film formation of the material layer is performed on the film formation substrate. Note that the heating area of the conductive-surface substrate which is rapidly heated is set to be the same size as the film formation substrate so that film formation on one film formation substrate is completed by one heating.

17 Claims, 11 Drawing Sheets

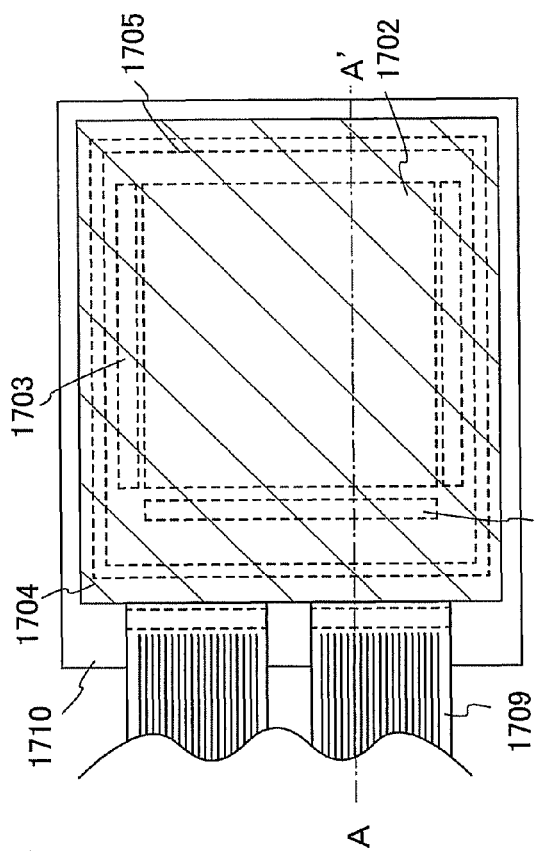
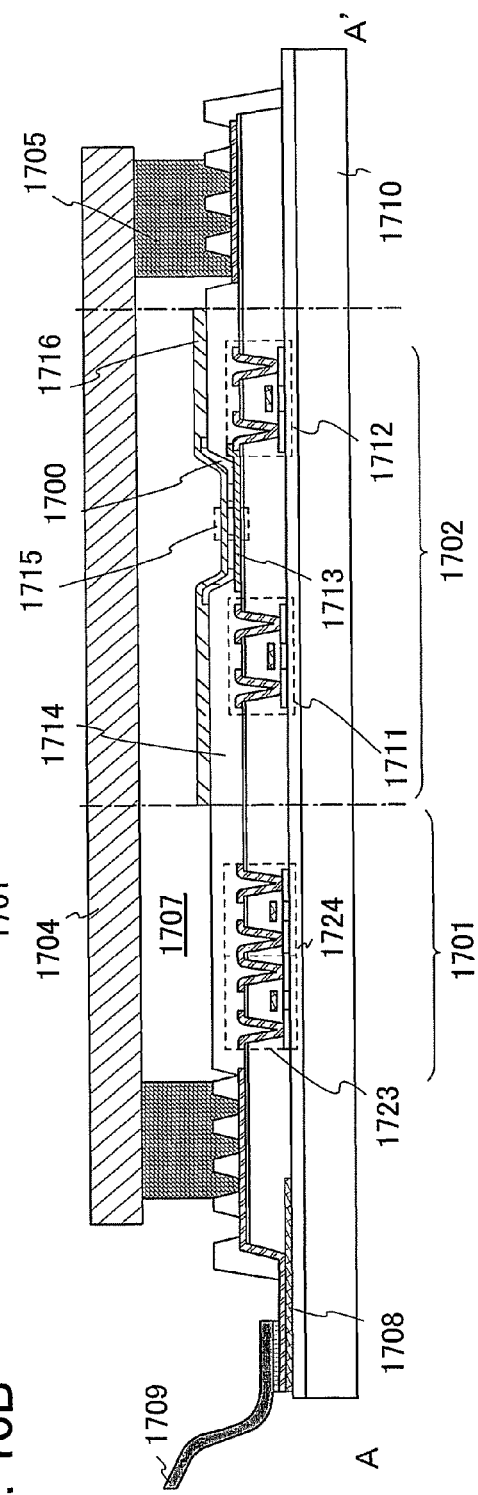
FIG. 10A
FIG. 10B

FILM FORMATION METHOD, AND METHOD FOR MANUFACTURING LIGHT-EMITTING DEVICE

BACKGROUND OF THE INVENTION

1. Field of the Invention

The present invention relates to a film formation apparatus that is used for film formation of a material that can be performed on a substrate and a manufacturing apparatus having the film formation apparatus. Further, the present invention relates to a film formation method with the use of the film formation apparatus. Further, the present invention relates to a light-emitting device including, as a light-emitting layer, a layer containing an organic compound that is formed with the film formation apparatus, and a method for manufacturing the light-emitting device.

2. Description of the Related Art

A light-emitting element containing an organic compound as a luminous body, which has features of thinness, lightness, high-speed response, and low voltage driving, is expected to be applied to a next-generation flat panel display. In particular, a display device in which light-emitting elements are arranged in matrix is considered to have advantages in a wide viewing angle and excellent visibility over a conventional liquid crystal display device.

A light-emitting mechanism of a light-emitting element is as follows: by application of a voltage between a pair of electrodes where a layer containing an organic compound is interposed, electrons injected from a cathode and holes injected from an anode are recombined with each other at an emitting center of the organic compound layer to form molecular excitons, and the molecular excitons release energy in returning to the ground state to emit light. Singlet excitation and triplet excitation are known as excited states, and it has been considered that light emission can be achieved through either of the excited states.

Further, a layer containing an organic compound has a stacked-layer structure typified by a stacked structure of a hole transport layer, a light-emitting layer, and an electron transport layer. Further, EL materials for forming EL layers are roughly classified into low molecular (monomer) materials and high molecular (polymer) materials, and film formation of a low molecular material is performed with a vapor-deposition apparatus.

A conventional vapor-deposition apparatus includes a substrate holder at which a substrate is set, a crucible (or a vapor-deposition boat) in which an EL material, that is, a vapor-deposition material is sealed, a shutter to prevent the rising of a sublimating EL material, and a heater to heat the EL material in the crucible. Then, the EL material heated by the heater sublimates to form a film over a rotating substrate. In the conventional vapor-deposition apparatus, for forming a uniform film, an enough distance between vapor-deposition source and substrate and substrate rotation are needed.

For example, in the case of using a substrate having a size of 300 mm×360 mm, a distance of more than or equal to 1 m is needed between the vapor-deposition source and the substrate. The larger the size of the substrate is, the longer the distance between the substrate and the crucible is needed proportionately. Therefore, there is a problem in that the whole size of the vapor-deposition apparatus is large and the structure of the apparatus is complicated.

Further, since the distance between the vapor-deposition source and the substrate is large, a material is scattered on the portion other than an object on which film formation is performed so that the amount of material attachment to an inner wall of a film formation chamber or the like is increased, which leads to degradation of material use efficiency and increase in frequency of maintenance of the device.

Further, since the distance between the vapor-deposition source and the substrate is large, the film formation speed is low and exhaust air in the film formation chamber takes a long time so that the throughput is reduced.

Further, a technique in which an organic EL transfer substrate obtained by forming a film of a light-emitting organic compound on at least one surface of a heat-resistant film is heated by heat bars so that the light-emitting organic compound is transferred to a transparent substrate having a transparent electrode is disclosed in Patent Document 1 (: Japanese Published Patent Application No. 2000-77182).

Further, a technique in which a donor sheet including a chromogenic organic donor layer and a substrate that are in contact with each other are irradiated with a radiant ray so that an organic material layer is formed on the substrate is disclosed in Patent Document 2 (: Japanese Published Patent Application No. 2003-308974).

Further, a technique in which a donor sheet provided with an organic donor material is heated by a roll-to-roll method so that a layer of an organic material is formed over a substrate is disclosed in Patent Document 3 (: Japanese Published Patent Application No. Hei10-245547).

SUMMARY OF THE INVENTION

The present invention is made to provide a vapor-deposition method in which the material use efficiency is higher than that in a conventional technique and the surface uniformity and the throughput are high. In particular, it is an object of the present invention to provide a film formation apparatus for forming a highly uniform film, without being provided with a film thickness monitor, and a film formation method thereof. Further, the present invention also provides a manufacturing method of a light-emitting device having, as a light-emitting layer, a layer containing an organic compound formed with the film formation apparatus.

Further, the present invention provides a manufacturing technique in which a film formation treatment is performed on a plurality of substrates to improve the throughput.

A conductive substrate on which a film containing an organic compound has been formed and a substrate on which film formation is performed (hereinafter referred to as a 'film formation substrate') disposed to face each other with a small distance, typically a distance in the range of 0.5 mm to 30 mm both inclusive, and a current is made to flow into the conductive substrate to perform heating, whereby a film containing an organic compound is formed on a surface of the film formation substrate, which faces the conductive substrate. The time which is taken to perform film formation can be as short as the period in which the current flows, though it depends on the size of the conductive substrate, so that film formation can be performed in a short period of time. The present invention solves at least one of the above-described objects.

Note that the thickness of the film formed by the film formation depends on the thickness of the film containing an organic compound which has been formed on the conductive substrate.

A structure of the present invention disclosed in this specification is a method for manufacturing a light-emitting device, in which: a first organic layer is formed over a first substrate having a conductive surface (hereinafter, a substrate having a conductive surface is referred to as a 'conductive-surface substrate'); an anode of a power source is electrically connected to one end of the first substrate; a cathode of the power source is electrically connected to the other end of the first substrate; a second substrate having a first electrode is disposed at a position to face the first substrate; the anode and the cathode are electrically connected to each other to heat the first organic layer over the first substrate; a second organic layer is formed over the first electrode provided for the second substrate surface which faces the first substrate; and a second electrode is formed over the second organic layer.

In the above-described structure, the second organic layer formed over the first electrode contains the same material as the first organic layer formed over the first substrate. Thus, it can be said that formation of the second organic layer in the above-described structure is transferring of an organic layer from the first substrate to the second substrate. Note that, in the present invention, since the organic layer sublimes and flies at least partially by energization of the first substrate to attach the second substrate so that film formation is performed, the film quality of the second organic layer can be improved than that of the first organic layer; for example, the second organic layer can be denser than the first organic layer. Further, depending on the material of the first organic layer, the thickness of the first organic layer and the second organic layer can be approximately the same as each other.

Further, in the above-described structure, selective film formation can be performed as well. For example, a mask (e.g., a metal mask) having an opening is disposed between the first substrate and the second substrate, and then, the first substrate is energized, so that the second organic layer can be formed selectively on the second substrate surface. In the case of forming a full-color light-emitting device, an organic layer can be formed selectively for each color of light emission. For example, an organic layer for emitting red (R) light is selectively formed, an organic layer for emitting green (G) light is selectively formed, and then, an organic layer for emitting blue (B) light is selectively formed, so that three kinds of pixels are formed.

Further, as the first conductive-surface substrate, a substrate made from a conductive material, a semiconductor substrate on which a conductive film is formed, or an insulating substrate on which a conductive film is formed may be used. As the substrate made from a conductive material, a metal plate of an element selected from Cu, Au, Al, Ag, Ti, Ni, W, Ta, Nb, Mo, Cr, Pt, Zn, Sn, In, and Mo, or an alloy plate containing the above element as the main component can be used. Alternatively, the semiconductor substrate (typically, a single-crystalline silicon substrate) on which a conductive film is formed can be used. As for the single-crystalline silicon substrate, it is circular and increase in area is difficult whereas the flatness is superior to that of a glass substrate or a metal substrate. Further, as for the insulating substrate on which a conductive film is formed, an insulating substrate such as a glass substrate, a quartz substrate, or a ceramics substrate can be used, and a conductive film containing an element selected from Cu, Au, Al, Ag, Ti, Ni, W, Ta, Nb, Mo, Cr, Pt, Zn, Sn, In, and Mo, or an alloy containing the above element as the main component can be used as the conductive film. However, as for the substrate made from a conductive material, it is preferable to select a material having the heat resistance that the material is not transformed so much by Joule heat generated by energization. Further, it is preferable that the surface average roughness Ra of the substrate made from a conductive material be less than 50 nm, and more preferably, in the range of 20 nm to 40 nm both inclusive. Further, in order to improve the flatness, a conductive film which is different from the substrate may be formed over the substrate made from a conductive material.

Further, it is preferable that the surface average roughness Ra of the insulating substrate on which a conductive film is formed be less than 20 nm, and more preferably, in the range of 1 nm to 10 nm both inclusive. The flatness of the substrate over which a material layer is formed largely affects the flatness of the material layer and also largely affects the flatness of a material layer which is formed over the film formation substrate; therefore, it is preferable that the flatness of the substrate over which a material layer is formed be as high as possible.

Further, it is preferable that the first conductive-surface substrate be rectangle and the area thereof be larger than that of the second substrate.

Further, the conductive substrate on both surfaces of which films containing organic compounds are formed may be interposed between two film formation substrates and a current may be supplied to the conductive substrate so that vapor deposition can be performed on the two film formation substrates at the same time, as well.

Another structure of the present invention disclosed in this specification is a film formation method, in which: a first organic layer is formed over a first surface of a first conductive-surface substrate; a second organic layer is formed over a second surface of the first substrate; an anode of a power source is electrically connected to one end of the first substrate; a cathode of the power source is electrically connected to the other end of the first substrate; a second substrate and a third substrate are disposed so as to face each other with the first substrate interposed therebetween; the anode and the cathode are electrically connected to each other to heat the first organic layer over the first surface and the second organic layer over the second surface; a third organic layer is formed over a surface of the second substrate which faces the first surface; and a fourth organic layer is formed over a surface of the third substrate which faces the second surface.

In the above-described structure, the third organic layer formed over the second substrate contains the same material as the first organic layer formed over the first surface of the first substrate. In addition, the fourth organic layer formed over the third substrate contains the same material as the second organic layer formed over the second surface of the first substrate.

Further, in the above-described structure, the first substrate and the second substrate are disposed to face each other with a small distance, typically a distance in the range of 0.5 mm to 30 mm both inclusive. In addition, the first substrate and the third substrate are disposed to face each other with a small distance, typically a distance in the range of 0.5 mm to 30 mm both inclusive. By reduction of the distance between the first substrate and the second substrate, the amount of material attachment to an inner wall of a film formation chamber can be reduced. Further, by reduction of the distance between the first substrate and the second substrate and between the first substrate and the third substrate, the footprint as a whole of a film formation apparatus can be reduced.

Further, in each above-described structure, the power source which is electrically connected to the conductive substrate when the conductive substrate is energized is either a direct-current power source or an alternating-current power source.

In a conventional crucible or vapor-deposition boat, the heat capacity of a material therein is uniformized by that the crucible or vapor-deposition boat is formed of a low heat conductive material such as ceramic; thus, it takes a long time to heat the material and obtain a stable vapor-deposition rate. Further, since vapor deposition is performed even until the stable vapor-deposition rate is obtained, a large amount of material is needed for the crucible or vapor-deposition boat in advance.

According to the film formation method of the present invention, film formation of a film which has been formed over a conductive substrate can be performed on a film formation substrate, so that there is no need to stabilize the vapor-deposition rate and film formation in a short period of time can be achieved.

Further, in a conventional vapor-deposition method, although a wire is heated by supplying a current in the case of using the coiled wire of tungsten or the like as a heat source, it is difficult to perform vapor deposition with high film thickness uniformity.

According to the film formation method of the present invention, as long as a film with high film thickness uniformity has been provided over the conductive substrate by a known method, a film with high film thickness uniformity which is almost similar to the film which has been provided can be formed over the film formation substrate. Further, by forming the film over the conductive substrate by a printing method in advance, the material use efficiency can be improved.

Further, in the technique in which heating is performed with a plurality of heat bars, which is disclosed in Patent Document 1, the substrate is partially heated and the heated region is belt-shaped having a shorter width than one side of the substrate; thus, the heat range is largely different from the scope of the present invention. Further, in the technique, for performing film formation on one transparent substrate, a vapor deposition process in which the transparent substrate and an organic EL transfer substrate are slid to be aligned and heating with the heat bars is performed is repeated.

According to the present invention, a large area of the substrate is heated uniformly and film formation on one substrate is performed by heating by one energization. It is needless to say that the alignment is performed only once; consequently, the film formation method of the present invention can achieve great reduction of film formation time. Furthermore, the plate area can be increased; for example, film formation can be performed on a large-area substrate with a size of 320 mm×400 mm, 370 mm×470 mm, 550 mm×650 mm, 600 mm×720 mm, 680 mm×880 mm, 1000 mm×1200 mm, 1100 mm×1250 mm, or 1150 mm×1300 mm. Further, film formation can also be performed in a short period of time by disposing, so as to face one large-area plate, a plurality of film formation substrates. Further, in the case of increasing the plate area, the range to be heated by energization is preferably increased in accordance with the plate area.

Further, the technique in which a donor sheet having a chromogenic organic donor layer and a substrate that are in contact with each other are irradiated with a radiant ray so that an organic material layer is formed over the substrate, which is disclosed in Patent Document 2, is largely different from the film formation method of the present invention in that the surfaces that face each other are disposed with a distance so as not to be in contact with each other in the film formation method of the present invention. In addition, heating by energization is not disclosed in Patent Document 2.

Further, a novel film formation apparatus is also disclosed in this specification.

A structure of the film formation apparatus is a film formation apparatus having a film formation chamber which is coupled to a vacuum exhaust process chamber for making the inside of the film formation chamber in the vacuum state, in which: the film formation chamber has a holding means for holding a film formation substrate, a first holding means and a second holding means for holding a conductive-surface substrate, and an alignment means for aligning the film formation substrate and the conductive-surface substrate with each other; a layer containing an organic compound is formed over the conductive-surface substrate; and the film formation apparatus has a power source for supplying a current between the first holding means and the second holding means through the conductive-surface substrate.

Further, the above-described film formation apparatus employs either a face-down system or a face-up system. Since the distance between the first substrate and the second substrate is small, there is no particular limitation on the direction of substrate planes; the substrate planes may be disposed so as to be perpendicular to or slanted off the bottom surface of the film formation chamber.

Further, in the above-described structure of the film formation apparatus, the film formation substrate and the conductive-surface substrate are disposed at positions to face each other, and a current is supplied between the first holding means and the second holding means to heat the conductive-surface substrate and the organic compound over the conductive-surface substrate is evaporated, so that a layer containing an organic compound is formed over a surface of the film formation substrate, which faces the conductive-surface substrate.

Further, in the above-described structure of the film formation apparatus, the structure may also have a mask holding means for holding a mask and an alignment means for aligning the mask and the film formation substrate with each other. By using the mask, selective film formation can be performed.

Further, a novel manufacturing apparatus having the above-described film formation apparatus is also disclosed in this specification.

Further, since adjustment of vapor-deposition rate by using a film thickness monitor is not needed to be performed in the above-described film formation apparatus, a manufacturing apparatus having the film formation apparatus can be totally automated. Further, one plate (a glass substrate having a conductive surface or a conductive substrate typified by a metal substrate) is used for film formation of one layer in the above-described film formation apparatus; that is, it can be said that a material is replenished every time by the amount which is needed for one film formation. In the conventional vapor-deposition apparatus, adjustment of vapor-deposition rate by using a film thickness monitor is needed, and thus, it is difficult to totally automatize the conventional vapor-deposition apparatus.

Further, in the conventional vapor-deposition apparatus, a material is manually replenished after the film formation chamber is made in the atmospheric pressure state once a material stored in a vapor-deposition source is run out. Since the capacity of the film formation chamber is large and the material use efficiency is low in the conventional vapor-deposition apparatus, replenishment is frequently performed. Because of this replenishment, a manufacturing apparatus having the conventional vapor-deposition apparatus is not suited to process many substrates successively, and it is difficult to totally automatize a procedure for processing many substrates successively.

A structure of the manufacturing apparatus disclosed in this specification is a manufacturing apparatus having a first film formation chamber, a carrier chamber which is coupled to the first film formation chamber, and a second film formation chamber which is coupled to the carrier chamber, in which: the first film formation chamber has a mechanism for applying a layer containing an organic compound over a conductive-surface substrate by a coating method in the first film formation chamber; the carrier chamber is coupled to a vacuum exhaust means for making the inside of the carrier chamber in the vacuum state; the second film formation chamber has a holding means for holding a film formation substrate, a first holding means and a second holding means for holding the conductive-surface substrate having the layer containing an organic compound over the surface, and an alignment means for aligning the film formation substrate and the conductive-surface substrate with each other; and a power source for supplying a current between the first holding means and the second holding means through the conductive-surface substrate disposed in the second film formation chamber is provided.

Further, in the above-described structure of the manufacturing apparatus, the film formation substrate and the conductive-surface substrate are disposed at positions to face each other in the second film formation chamber, and a current is supplied between the first holding means and the second holding means to heat the conductive-surface substrate and the organic compound over the conductive-surface substrate is evaporated so that a layer containing an organic compound is formed over a surface of the film formation substrate which faces the conductive-surface substrate.

Further, in the above-described structure of the manufacturing apparatus, the second film formation chamber may also include a mask holding means for holding a mask and an alignment means for aligning the mask and the film formation substrate with each other. By using the mask, selective film formation can be performed.

In the first film formation chamber, an organic compound layer with a flat surface can be formed over the conductive-surface substrate by a coating method. The conductive-surface substrate is a flat plate having a very flat surface, and by using a spin-coating method, for example, an organic compound layer which is flat and has a uniform thickness can be formed over the conductive-surface substrate.

In Patent Document 3, an organic donor material is provided for a donor sheet which is metal foil. Because of a roll-to-roll method, it is difficult to form a uniform film over a long and thin surface. Further, in Patent Document 3, when a voltage is applied to the donor sheet, a current flows into not only a film formation apparatus but also the donor sheet outside of the film formation apparatus, for example, in the portions rolled by rolls because of the web shape, and thus, the loss of the current is large. Therefore, a large current is needed for one film formation.

The present invention in which a rectangular conductive-surface substrate is used can provide a film which is more uniform than that by the roll-to-roll method. Further, the present invention in which a voltage is applied only to one conductive-surface substrate per one film formation can greatly reduce the power consumption of the whole manufacturing apparatus.

Further, the donor sheet, which is metal foil, disclosed in Patent Document 3 might tear; thus, there is limitation on reduction of the thickness. In addition, if the sheet itself is too thin, specifically in the case where the thickness of less than or equal to 0.1 mm, a tape formed of the sheet is easily bowed; therefore, it is difficult to form a uniform film over the tape.

In the present invention, a quartz substrate or a glass substrate having, as a surface, a thin metal film formed by a sputtering method, a CVD method, or the like can be used. Thus, a uniform thin metal film with a thickness in the range of 100 nm to 0.1 mm both inclusive can be formed. As for the quartz or glass substrate, a surface average roughness Ra of less than or equal to 1 nm can be realized by further performing polishing, so that a surface which is far flatter than that of a metal substrate can be obtained. By a polishing technique, the surface average roughness Ra of the glass substrate can be 0.2 nm and a surface maximum roughness Rmax of the same can be less than or equal to 3 nm. Specifically, it is preferable that the surface average roughness Ra of the thin metal film provided over the quartz or glass substrate be in the range of 1 nm to 10 nm both inclusive. In the present invention, the flatness of the substrate over which a material layer is formed largely affects the flatness of the material layer and also largely affects the flatness of a material layer which is formed over the film formation substrate; therefore, it is preferable that the flatness of the substrate over which a material layer is formed be as high as possible.

Further, if a glass substrate provided with a thin metal film with a thickness from 100 nm to 0.1 mm both inclusive is used, film formation in a shorter period of time can be performed than the case of using metal foil which is thicker than 0.1 mm.

Providing that film formation is performed with the same power source, it takes about 5 seconds in the case of using a 0.1-mm tungsten substrate, whereas it takes about from 30 seconds to 1 minute in the case of using a 0.2-mm tungsten substrate. According to this, the thinner the thickness is, the more Joule heat is generated so that film formation in a shorter period of time can be performed.

Note that it was able to be confirmed that the film formation method of the present invention can be implemented by using a quartz substrate provided with a 100-nm tungsten thin film. Further, depending on the material of the thin metal film, vapor deposition of a thin metal film even with a thickness of less than 100 nm can be performed as long as the electric resistance does not become too high. However, the film thickness of less than 100 nm is not preferable since the electric resistance becomes high and a large current flow.

Further, a vapor-deposition method using a vapor-deposition boat is known. The vapor-deposition boat is formed of tungsten, molybdenum, tantalum, or the like, and has a depression in which a vapor-deposition material is stored. The vapor-deposition boat which is also heated by energization has a long and thin rectangular shape with a size as a whole of 10 mm×5 mm, 50 mm×5 mm, or 112 mm×25 mm, for example. Since the vapor-deposition material is stored in the depression of the vapor-deposition boat, the area in which the vapor-deposition material is stored is smaller than the size as a whole, and is about 50 mm×20 mm at a maximum.

In the present invention, a flat conductive-surface substrate which has almost the same size as a film formation substrate is used, which is largely different from the vapor-deposition boat. The conductive-surface substrate does not have a depression unlike the vapor-deposition boat and is flat, which contributes to the uniformity in thickness of a film formed over the film formation substrate. The vapor-deposition boat, whose storing capacity in the depression is increased in order to perform film formation on a plurality of substrates or in consideration of the loss of evaporation until the vapor-deposition rate is stabilized, is largely different from the present invention in the method of using, and is not a vapor-deposition source aiming for uniformity of film thickness. In the present invention, one conductive-surface substrate and provided with a material layer is used for one film formation.

By the present invention, film formation in a short period of time can be performed and reduction of a period of time for manufacturing a light-emitting device can be achieved.

BRIEF DESCRIPTION OF THE DRAWINGS

FIGS. 10A and 10B are views showing a structure of a light-emitting device.

DETAILED DESCRIPTION OF THE INVENTION

Embodiment modes and embodiments of the present invention will be described hereinafter.

Embodiment Mode 1

Figure 1A:
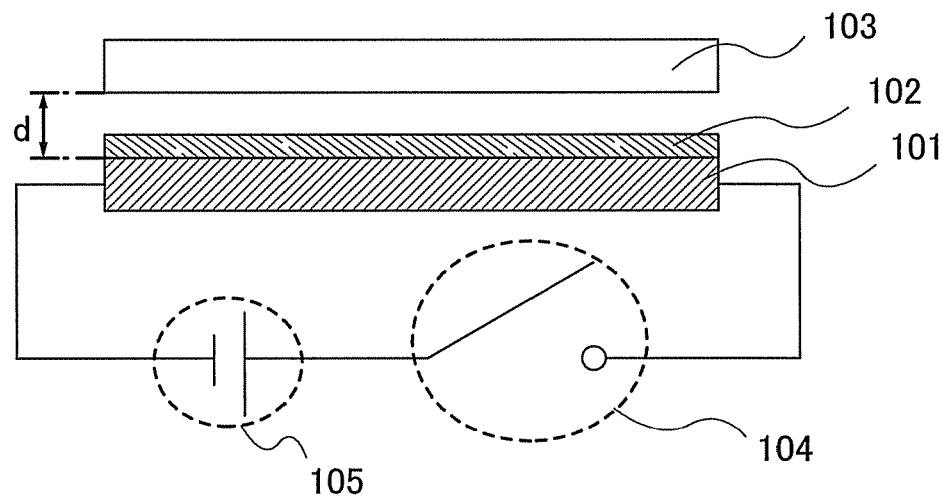
FIGS. 1A and 1B are cross-sectional views of a film formation process.
Figure 1B:
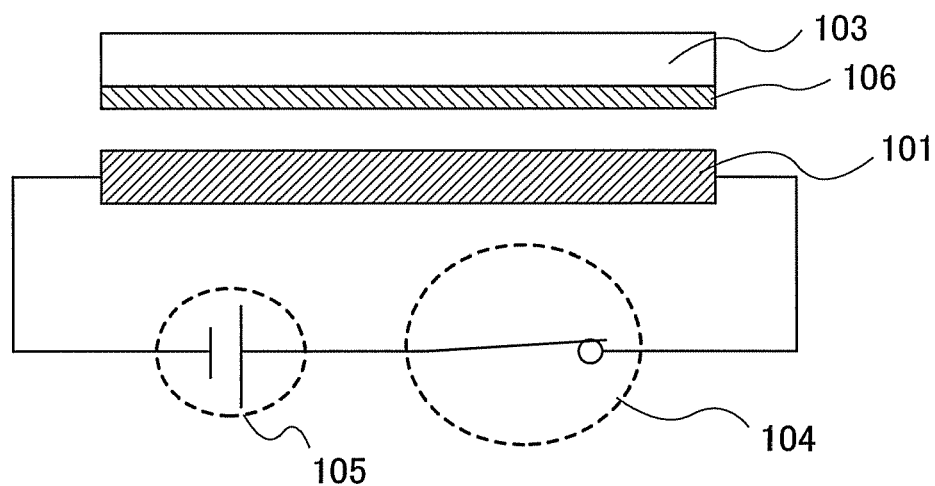

A film formation method is described using FIGS. 1A and 1B. FIG. 1A is a simple cross-sectional view of a film formation apparatus.

First, a first organic layer 102 is formed over a first substrate 101 by a coating method. Then, the first substrate 101 is carried into a film formation chamber.

The film formation chamber is preferably exhausted to be in the vacuum state until the degree of vacuum reaches less than or equal to $5 \times 10^{-3}$ Torr (0.665 Pa), and more preferably $10^{-4}$ to $10^{-6}$ Pa. A vacuum exhaust means coupled to the film formation chamber performs vacuum exhaust of the pressure from the atmosphere to approximately 1 Pa with an oil-free dry pump, and vacuum exhaust of the pressure of approximately 1 or more Pa with a magnetic levitation turbo molecular pump or a complex molecule pump. For the film formation chamber, a cryopump may also be provided in order to remove moisture. Accordingly, pollution by, mainly, an organic matter such as oil from the exhaust means is prevented. An inner wall surface is subjected to mirror surface treatment by electrochemical polishing to reduce its surface area so that gas discharge is prevented.

Next, a second substrate 103 is disposed so as to face the substrate surface provided with the first organic layer 102. Note that they are disposed such that the first organic layer 102 and the second substrate 103 are not in contact with each other. In addition, a distance between the first substrate 101 and the second substrate 103, d, is set in the range of 0.5 mm to 30 mm both inclusive.

Further, the first substrate 101 is a conductive metal plate, and as shown in FIG. 1A, a power source 105 for electrically connecting to the first substrate 101 and a switch 104 are provided. Note that the switch 104 is provided outside of the film formation chamber and can be operated by a user. Further, the power source 105 is provided either outside of the film formation chamber or inside of the film formation chamber. FIG. 1A is the view when the switch 104 is OFF, that is, the view before a film formation treatment.

Then, the first substrate and the second substrate are faced each other with a small distance, typically a distance in the range of 0.5 mm to 30 mm both inclusive in the film formation chamber, and the switch 104 is turned on to supply a current from the power source 105 to the first substrate so that heating is performed.

Instantaneously after the current is supplied to the first substrate, film formation is performed on the second substrate 103 as shown in FIG. 1B. In this way, a second organic layer 106 is formed over one surface of the second substrate 103, that is, a surface which faces the first substrate. According to the film formation method shown in FIGS. 1A and 1B, film formation can be performed on a film formation substrate without wasting a desired film formation material. Further, the film formation material can be prevented from being attached to an inner wall of the film formation chamber so that maintenance of the film formation apparatus can be simplified. Further, unlike the conventional vapor-deposition apparatus, vapor deposition is not needed to be performed until the vapor-deposition rate is stabilized with a film thickness monitor. Thus, the structure of the film formation apparatus can be simple.

Further, although the size of the first substrate 101 and the second substrate 103 is the same as each other in FIGS. 1A and 1B, there is no particular limitation on their size; one of them may have a larger area than the other, as well.

Further, in the case where selective film formation is performed, a mask having an opening may be disposed between the first substrate and the second substrate.

An experiment on uniformity of film thickness with film formation actually performed and results thereof are described below.

Experiment 1

A flat plate having an area of 10 cm×10 cm was used as a first substrate. A material of the first substrate was tungsten, and the thickness of the plate was 0.1 mm. In Experiment 1, a material solution in which chloroform was used as a solvent and Alq was dispersed was prepared. The weight ratio (chloroform:Alq) was set to 1:0.01.

By a spin-coating method, the material solution containing Alq was dropped and the first substrate was spinned so that a first organic layer was formed over the first substrate. Then, the periphery of the first substrate was wiped with a cloth soaked with acetone so that the first organic layer in the periphery of the first substrate was removed.

Next, a glass substrate was prepared as a second substrate and disposed so as to face a surface of the first substrate, over which the first organic layer has been formed. A distance between the first substrate and the second substrate, d, was set to 1.5 mm.

Then, two portions in the periphery of the first substrate were sandwiched with a conductive electrode plate, and a current of 100 A is made to flow into an electrically-connected wire for 5 seconds.

At the moment of the current supply, a second organic layer was formed over the second substrate with a uniform thickness. The thickness distribution of the second organic layer was able to be ±6%. This thickness distribution of the second organic layer within the substrate surface was shown in FIG.

Figure 2A:
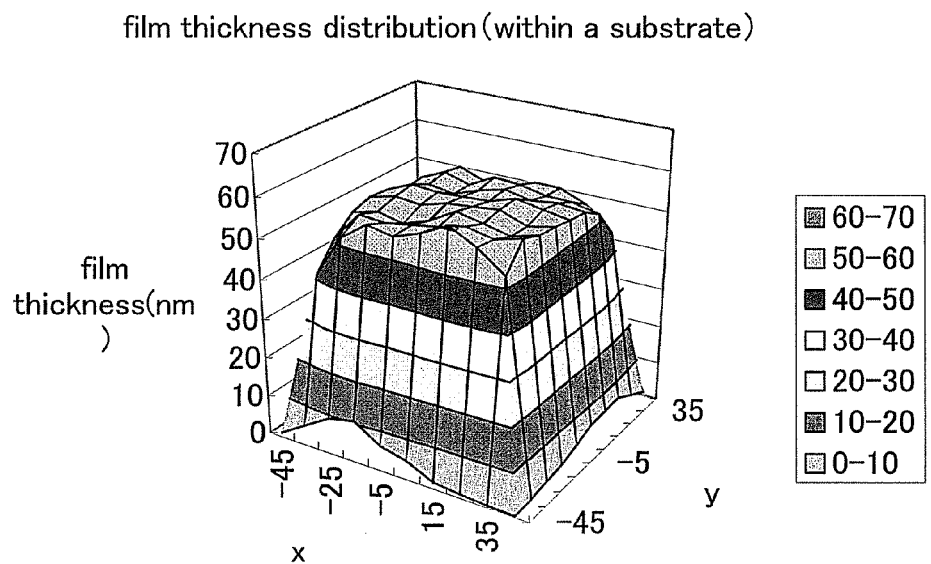
FIG. 2A is a graph showing film thickness distribution within a substrate surface of an organic layer and FIG. 2B is a graph showing film thickness distribution in a region of 5 cm×5 cm in the center of a substrate.
Figure 2B:
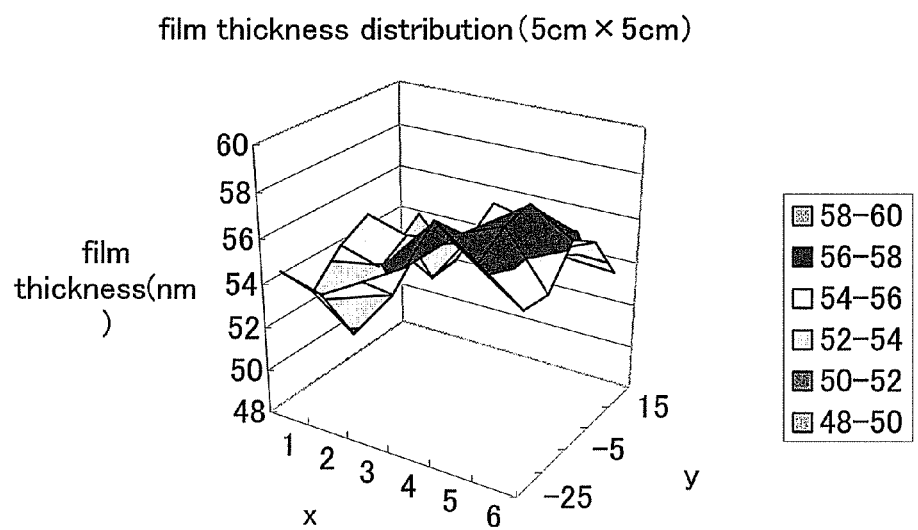

2A. Further, the thickness distribution of the second organic layer in the central area of 5 cm×5 cm of the second substrate was shown in FIG. 2B.

Embodiment Mode 2

In this embodiment mode, a method for manufacturing a light-emitting device is described.

A first organic layer is formed over a conductive substrate, the conductive substrate is disposed to face a film formation substrate, and a current is supplied to the conductive substrate so that a second organic layer is formed over the film formation substrate. Over the film formation substrate, a plurality of first electrodes has been formed. If required, a sidewall for isolating the first electrodes which are adjacent to each other from each other is provided.

Then, in order to form a stacked layer, a plurality of substrates is prepared and each of a plurality of organic layers is formed in a similar manner to the above manner. For example, in the case where a hole transport layer, a light-emitting layer, and an electron injection layer are sequentially stacked, they have been formed over a plurality of substrates respectively. Current is supplied to a first metal plate provided with an organic layer which becomes a hole transport layer so that the hole transport layer is formed over a first electrode of a glass substrate, a current is supplied to a second metal plate provided with an organic layer which becomes a light-emitting layer so that the light-emitting layer is formed over the hole transport layer of the glass substrate, and a current is supplied to a third metal plate provided with an organic layer which becomes an electron injection layer so that the electron injection layer is formed over the light-emitting layer of the glass substrate.

Then, a second electrode is formed over the stacked layer of the organic layers which is overlapped with the first electrode is formed by a known method. Through the above, a light-emitting device including a light-emitting element can be formed.

An experiment in actual manufacture of a light-emitting element and results thereof will be described below.

Experiment 2

First, two conductive substrates (a first conductive substrate and a second conductive substrate) were prepared; a flat plate having an area of 9 cm×9 cm was used as each of the conductive substrates. A material of each conductive substrate was tantalum, and the thickness of the substrate was 0.1 mm.

Over the first conductive substrate, a first organic layer containing NPB was formed. In Experiment 2, a material solution in which chloroform was used as a solvent and NPB was dispersed was prepared. The weight ratio (chloroform: NPB) was set to 1:0.005.

A glass substrate was disposed to face the first conductive substrate, and a current was supplied to the first conductive substrate, so that a film containing NPB (with a thickness of 75 nm) was formed over the glass substrate. Note that a plurality of first electrodes formed of ITO films containing silicon has been provided over the glass substrate and the film containing NPB was formed over the first electrodes.

Further, over the second conductive substrate, a second organic layer containing Alq and C6 was formed. In Experiment 2, a material solution in which chloroform was used as a solvent and Alq and C6 were dispersed was prepared. The weight ratio (chloroform:Alq:C6) was set to 1:0.005:0.00005.

Next, the above-described glass substrate was disposed to face the second conductive substrate, and a current was supplied to the second conductive substrate, so that a film containing Alq and C6 (with a thickness of 70 nm) was formed over the glass substrate.

Next, a stack of a 1-nm LiF film and an Al film is formed over the glass substrate by a vapor-deposition method. This Al film functions as a second electrode of a light-emitting element.

Figure 3A:
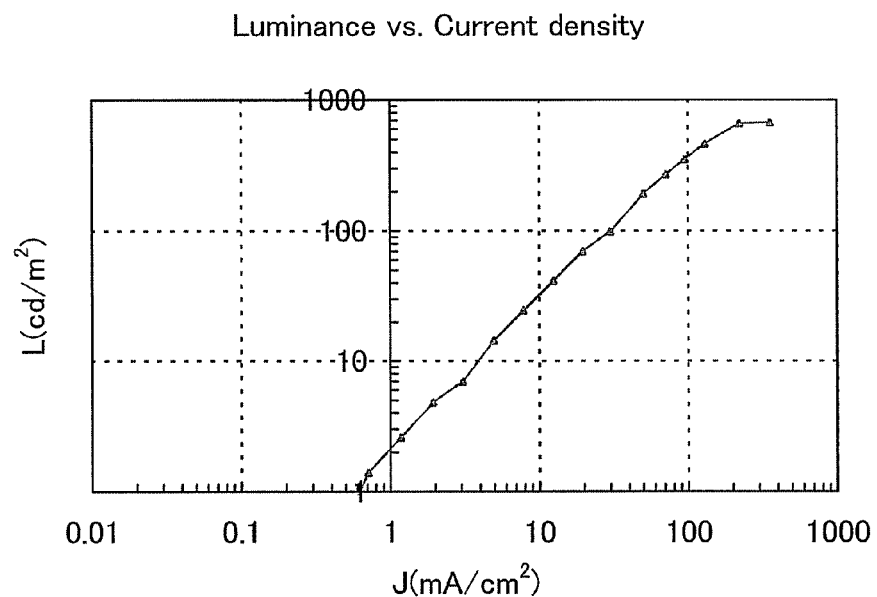
FIG. 3A is a graph showing luminance vs. current density characteristics.
Figure 3B:
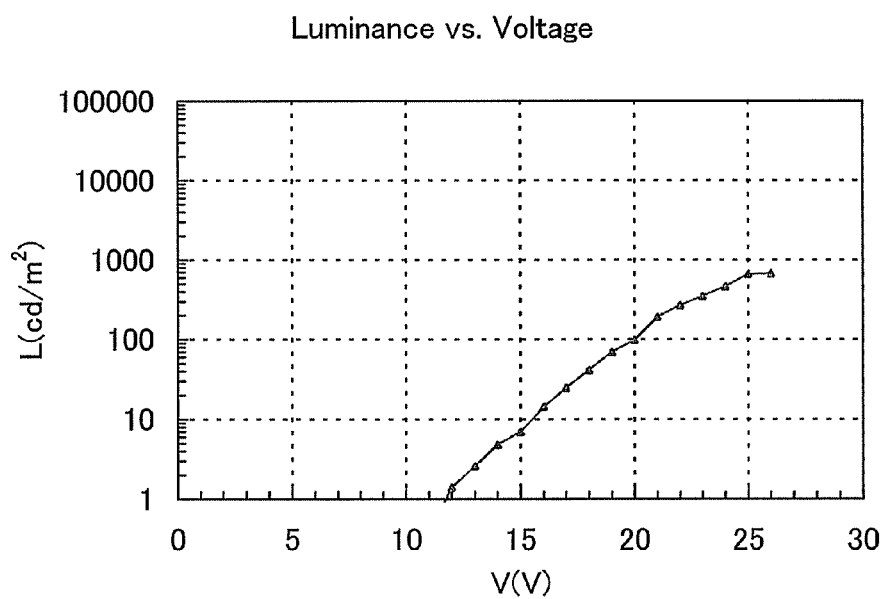
FIG. 3B is a graph showing luminance vs. voltage characteristics.

Characteristics of the light-emitting element thus formed, luminance vs. current density characteristics, is shown in FIG. 3A, and luminance vs. voltage characteristics of the light-emitting element is shown in FIG. 3B.

Embodiment Mode 3

In this embodiment mode, one example of an apparatus structure which is different from that described in Embodiment Mode 1 is described. In this embodiment mode, vapor deposition is performed on two film formation substrates is performed, at the same time with a film formation apparatus shown in FIGS. 4A and 4B.

First, a first organic layer 402 is formed over one surface of a first substrate 401 and a second organic layer 407 is formed over the other surface of the first substrate 401. Then, the first substrate 401 having the organic layers over both the surfaces is carried into a film formation chamber.

The film formation chamber is preferably exhausted to be in the vacuum state until the degree of vacuum reaches less than or equal to $5 \times 10^{-3}$ Torr (0.665 Pa), and more preferably $10^{-4}$ to $10^{-6}$ Pa.

Next, a second substrate 403 is disposed to face the substrate surface provided with the first organic layer 402. In addition, a third substrate 408 is disposed to face the substrate surface provided with the second organic layer 407.

Note that they are disposed such that the first organic layer 402 and the second substrate 403 are not in contact with each other and the second organic layer 407 and the third substrate 408 are not in contact with each other.

Further, a distance between the first substrate 401 and the second substrate 403, d1, is set in the range of 0.5 mm to 30 mm both inclusive. A distance between the first substrate 401 and the third substrate 408, d2, is also set in the range of 0.5 mm to 30 mm both inclusive.

Figure 4A:
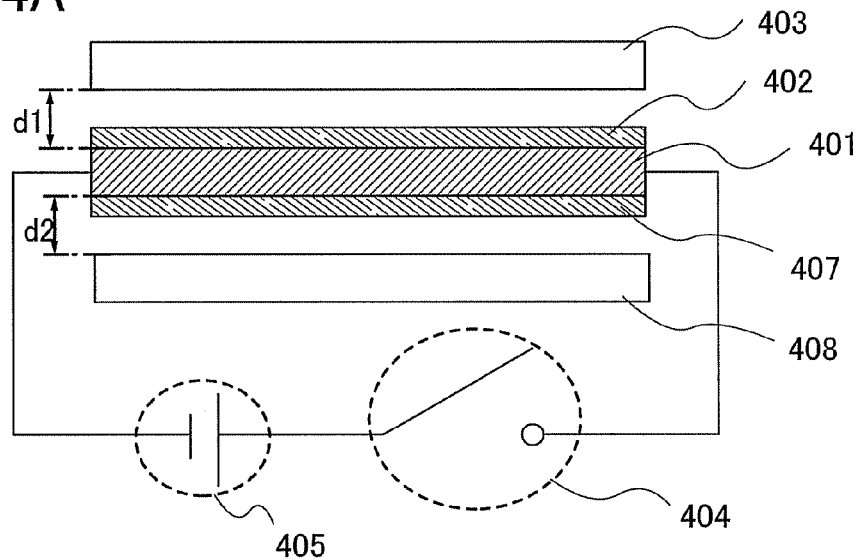
FIGS. 4A and 4B are cross-sectional views of a film formation process.

Further, the first substrate 401 is a conductive metal plate, and as shown in FIG. 4A, a power source 405 for electrically connecting to the first substrate 401 and a switch 404 are provided. Note that the switch 404 is provided outside of the film formation chamber and can be operated by a user. Further, the power source 405 is provided either outside of the film formation chamber or inside of the film formation chamber. FIG. 4A is the view when the switch 404 is OFF, that is, the view before a film formation treatment.

Then, the switch 404 is turned on to supply a current from the power source 405 to the first substrate so that heating is performed.

Figure 4B:
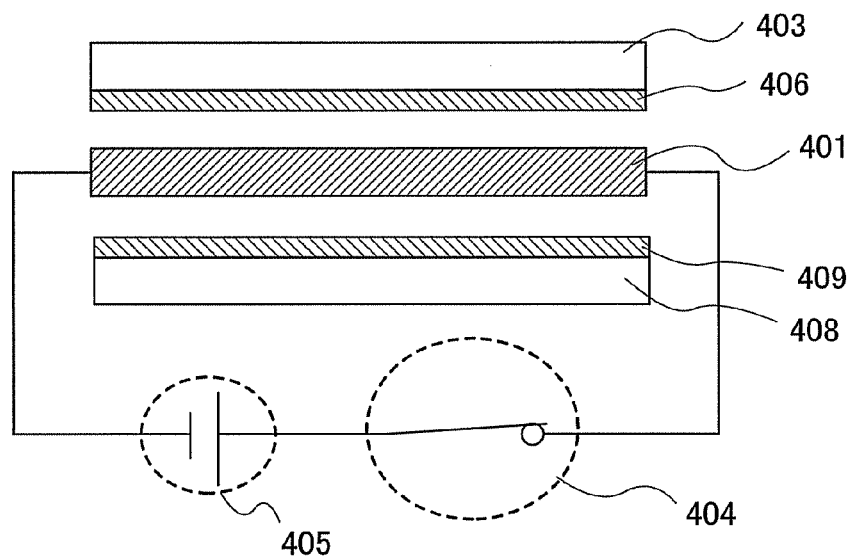

Instantaneously after the current is supplied to the first substrate, film formation is performed on the second substrate 403 and the third substrate 408 as shown in FIG. 4B. In this way, a third organic layer 406 is formed over one surface of the second substrate 403, that is, the surface which faces the first substrate, of the second substrate 403 and a fourth organic layer 409 is formed over one surface of the third substrate 408, that is, the surface which faces the first substrate, of the third substrate 408.

With the film formation apparatus shown in FIGS. 4A and 4B, the size of a current used for heating the first substrate is almost the same as that in Embodiment Mode 1 even if vapor deposition is performed on two substrates. Thus, since film formation on two substrates can be performed with the same amount of current as that in Embodiment Mode 1, it can be said that film formation can be performed efficiently.

Further, with the film formation apparatus shown in FIGS. 4A and 4B, film formation can be performed on a film formation substrate without wasting a desired film formation material. Further, the film formation material can be prevented from being attached to an inner wall of the film formation chamber so that maintenance of the film formation apparatus can be simplified. Further, unlike the conventional vapor-deposition apparatus, vapor deposition is not needed to be performed until the vapor-deposition rate is stabilized with a film thickness monitor. Thus, the structure of the film formation apparatus can be simple.

Further, this embodiment mode can be combined with any of Embodiment Mode 1 and Embodiment Mode 2 as appropriate.

On the present invention having the above-described structures, further specific description will be made with embodiments below.

Embodiment 1

Figure 5:
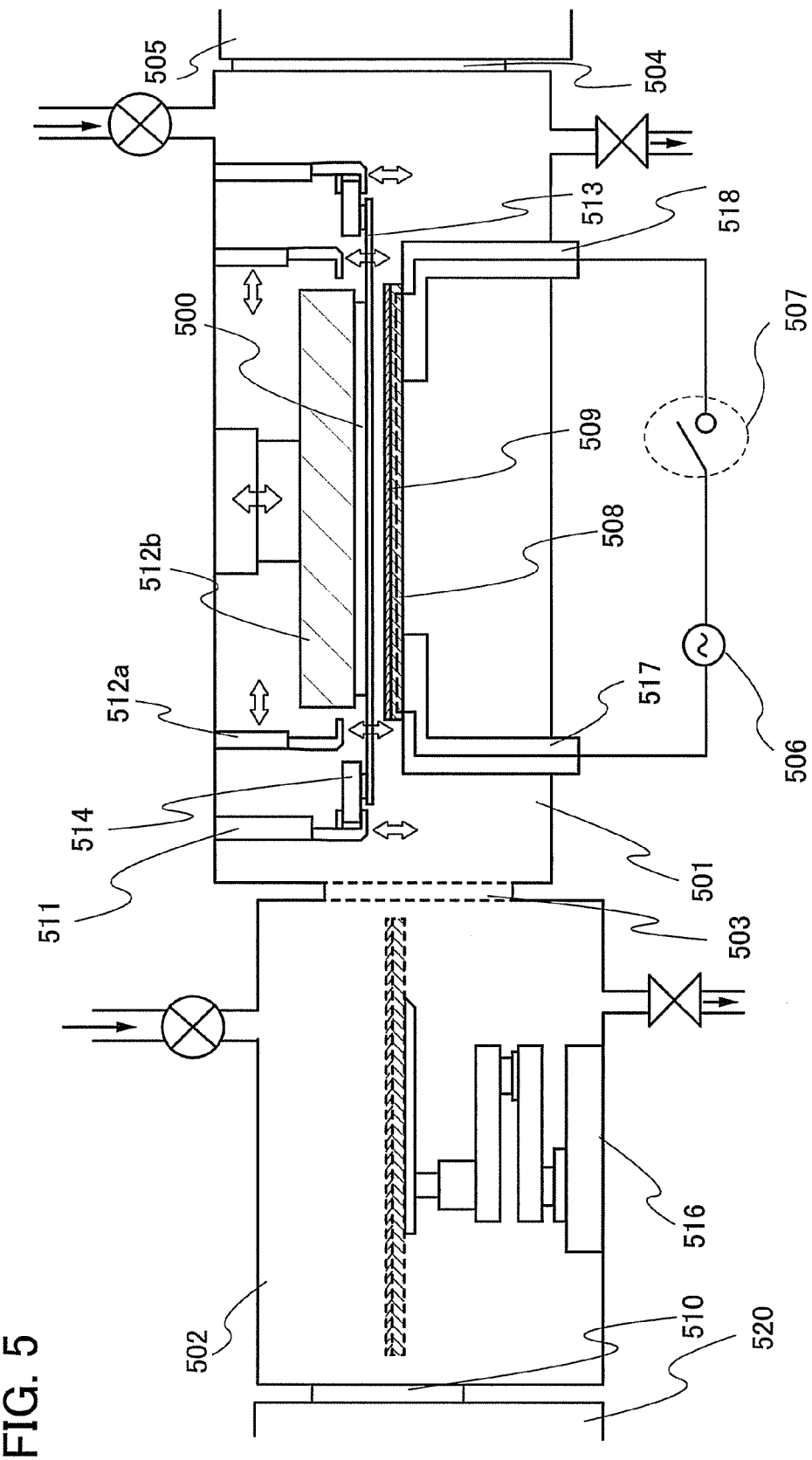
FIG. 5 is a cross-sectional view of one example of a manufacturing apparatus.

In this embodiment, one example of a manufacturing apparatus having the film formation apparatus described in Embodiment Mode 1 is described using FIG. 5. A manufacturing apparatus shown in FIG. 5 employs chamber arrangement aiming for task improvement.

In FIG. 5, a film formation chamber 501 is coupled to an installation chamber 502 and a carrier chamber 505. Further, the installation chamber 502 is coupled to a coating chamber 520. Further, gate valves 503, 504, and 510 are provided between the film formation chamber 501 and the installation chamber 502, between the film formation chamber 501 and the carrier chamber 505, and between the installation chamber 502 and the coating chamber 520, respectively.

The coating chamber 520 is a film formation chamber for forming a material layer 509 containing an organic compound over a conductive-surface substrate 508. In the coating chamber 520, the material layer 509 is applied by a spin-coating method, a spray method, or the like in the atmospheric pressure or a reduced pressure and then baked. A load chamber for introducing the conductive-surface substrate 508 and/or a heating chamber for baking may also be coupled to the coating chamber 520.

The installation chamber 502 is coupled to a vacuum exhaust process chamber such that inside the installation chamber 502 can be evacuated by vacuum exhaust. Further, the installation chamber 502 is coupled to an inert gas introduction system for introducing an inert gas so that inside the film formation chamber is made in the atmospheric pressure state. Further, the installation chamber 502 is provided with a carrier unit 516 such as a carrier robot arm, and a substrate 500 or the conductive-surface substrate 508 is carried between the coating chamber 520 and the film formation chamber 501 with the use of the carrier unit 516. Further, the installation chamber 502 may be provided with a holder for stocking a plurality of the conductive-surface substrates 508 or the substrates 500. Further, a load chamber for introducing the substrate 500 may be coupled to the installation chamber 502.

The film formation chamber 501 is coupled to a vacuum exhaust process chamber, which is preferably evacuated by vacuum exhaust so as not to mix moisture or the like. Further, the film formation chamber 501 is coupled to an inert gas introduction system for introducing an inert gas so that inside the film formation chamber is made in the atmospheric pressure state. Note that it is preferable that open to atmosphere of the film formation chamber be prevented as much as possible. Various gases in addition to moisture are adsorbed to an inner wall when the film formation chamber is opened to atmosphere, and they are discharged by vacuum exhaust. It is said that it takes several tens to several hundreds hours to stop discharging the adsorbed gas and stabilize the degree of vacuum to a balanced value. Therefore, the time is shortened by subjecting the wall of the film formation chamber to baking treatment.

Further, the film formation chamber 501 has a first holding means for holding the substrate 500 which is a film formation substrate, a second holding means for holding the conductive-surface substrate 508, and a power source 506 for supplying a current to the conductive-surface substrate 508. In the film formation chamber 501, an alignment mechanism 512a and an alignment mechanism 512b are provided as the first holding means. In addition, in the film formation chamber 501, a cathode-side holder 517 and an anode-side holder 518 are provided as the second holding means.

Further, as a material for the inner wall of the film formation chamber, aluminum, stainless steel (SUS: Steel special Use Stainless), or the like which has been electropolished to have a mirror surface is used because the degree of adsorption of an impurity such as oxygen or moisture can be reduced by reducing the surface area of the inner wall. Accordingly, the degree of vacuum in the film formation chamber can be maintained to $10^{-5}$ to $10^{-6}$ Pa. Further, a material such as ceramics which has been processed so that there are quite few air holes is used as an inner member. Note that such a material has preferably surface smoothness where the center line average roughness is 3 nm or less.

When the conductive-surface substrate 508 is set at the second holding means, the cathode-side holder 517 and the anode-side holder 518 are electrically connected to the power source 506 and the switch 507. However, the other components of the film formation chamber 501 (e.g., the inner wall of the chamber) are electrically insulated from the power source 506.

Further, selective film formation can be performed with a mask 513 in the film formation chamber 501. The thin-plate mask 513 having a pattern opening is fixed to a frame-shaped mask frame 514 by adhesion or weld. It is preferable to perform vapor deposition by heating which is suited for a vapor-deposition material, and the position at which the mask 513 is fixed may be determined as appropriate so that moderate tension is applied at the heating temperature. Further, alignment with the substrate 500 is performed with the mask holder 511 for supporting the mask 513 and the mask frame 514. First, the substrate 500 which has been carried is supported by the alignment mechanism 512a and installed in the mask holder 511. Then, the substrate 500 provided over the mask 513 is moved toward the alignment mechanism 512b so that the substrate 500 in addition to the mask 513 is attracted and fixed by magnetic force. Note that the alignment mechanism 512b is provided with a permanent magnet (not shown) or a heating means (not shown).

Further, the carrier chamber 505 is coupled to a vacuum exhaust process chamber such that inside the carrier chamber 505 can be evacuated by vacuum exhaust and after that, can be made in the atmospheric pressure state by introduction of an inert gas. Further, the carrier chamber 505 is provided with a carrier unit such as a carrier robot arm, and the substrate 500 after completion of film formation is carried from the film formation chamber 501 to an unload chamber with the use of the carrier unit 516. Further, the carrier chamber 505 may be provided with a holder for stocking a plurality of the substrates 500 after completion of film formation.

When the conductive-surface substrate 508 is disposed on the holder in the film formation chamber 501, the conductive-surface substrate 508 is installed in the second holding means in the film formation chamber 501 from the coating chamber 520 with the use of the carrier unit 516 provided in the installation chamber 502. In this way, by provision of the installation chamber 502 and switching as appropriate between vacuum and atmospheric pressure in the installation chamber, inside the film formation chamber 501 can remain the vacuum state.

Here, one example of a procedure for film formation on the substrate 500 with the use of the conductive-surface substrate 508 provided with the material layer 509 is described below.

First, coating is performed on the conductive-surface substrate 508 by a spin-coating method in the coating chamber 520 and baking is performed so that the material layer 509 is formed.

Then, the conductive-surface substrate 508 is carried into the installation chamber 502 with the carrier unit 516, and the gate valve 510 is closed. Then, the installation chamber is evacuated until the degree of vacuum reaches almost that of the film formation chamber 501. Then, the gate valve 503 is opened, and the conductive-surface substrate 508 is put on the cathode-side holder 517 and the anode-side holder 518. Note that a pin or a clip for fixing the conductive-surface substrate 508 to the cathode-side holder 517 and the anode-side holder 518 may be provided so as to prevent misalignment of the conductive-surface substrate 508.

Next, the substrate 500 and the conductive-surface substrate 508 are kept to be parallel to each other, and the distance between the substrate 500 and the conductive-surface substrate 508 is fixed in the range of 0.5 mm to 30 mm both inclusive by adjustment with the alignment mechanism 512b.

Next, the switch 507 is turned on so that a current is supplied from the power source 506 to the cathode-side holder 517 and the anode-side holder 518. By supplying a current to the cathode-side holder 517 and the anode-side holder 518, the conductive-surface substrate 508 is instantaneously heated and the material layer 509 is evaporated so that film formation is performed on one surface of the substrate 500, that is, the surface which faces the conductive-surface substrate 508.

Film formation is completed through the above-described procedure. In this way, film formation can be performed in a short period of time without using a film thickness monitor.

Further, there is no limitation on a procedure for disposing the substrate 500 inside the film formation chamber 501, though it is omitted in the above-described procedure.

The film formation chamber shown in FIG. 5 is the example in which an alignment mechanism is not provided for the second holding means; therefore, it is preferable that the substrate 500 be disposed after the conductive-surface substrate 508 is disposed in the film formation chamber 501. Note that the film formation chamber shown in FIG. 5 is just an example; the substrate 500 may be disposed before the conductive-surface substrate 508 is disposed in the film formation chamber 501 as long as an alignment mechanism is provided for the second holding means.

Therefore, in the present invention, the substrate 500 may be disposed either before the conductive-surface substrate 508 is disposed in the film formation chamber 501 or after the conductive-surface substrate 508 is disposed in the film formation chamber 501.

The film formation chamber shown in FIG. 5 is a so-called face-down film formation chamber in which the surface over which a film is to be formed of the film formation substrate is placed as a lower surface, but may be a face-up film formation chamber as well. In a conventional vapor-deposition apparatus, it is difficult to adapt a face-up film formation apparatus since a powdery vapor-deposition material is stored in a crucible or a vapor-deposition boat.

Further, the film formation chamber shown in FIG. 5 can be remodeled to be a so-called substrate-vertically-disposed film formation apparatus, which has a structure in which the surface over which a film is to be formed of the film formation substrate is vertically set up with respect to the horizontal surface, as well. Further, the surface over which a film is to be formed of the film formation substrate is not limited to be vertical with respect to the horizontal surface but may be slanted off the horizontal surface as well. In the case of a large-area substrate which is easily deflected, vertical set up of the surface of the film formation substrate is preferable since the deflection of the film formation substrate (and the mask) can be reduced.

That is, there is no particular limitation on the direction of the film formation substrate in the film formation chamber shown in FIG. 5, and as long as the film formation substrate and the conductive-surface substrate can be disposed at a distance of less than or equal to 100 mm, and preferably less than or equal to 5 mm, the film formation apparatus can drastically improve the use efficiency of a vapor-deposition material and throughput.

Further, the present invention may be a multi-chamber manufacturing apparatus in which the film formation chamber shown in FIG. 5 is provided as one chamber. Further, it is needless to say that the film formation chamber 501 shown in FIG. 5 can be provided as one chamber in an in-line manufacturing apparatus as well.

Note that this embodiment can be combined with any one of Embodiment Modes 1 to 3 as appropriate.

Figure 6A:
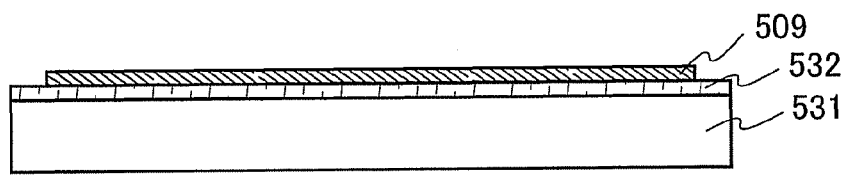
FIGS. 6A and 6B are cross-sectional views of one example of a conductive-surface substrate and one example of a manufacturing apparatus, respectively.

Further, sine the example in which a flat metal plate is used as the conductive-surface substrate is described in this embodiment, electrical connection with a power source is performed in a rear surface of the conductive-surface substrate. However, in the case where a light-transmitting insulating substrate on which a conductive film 532 has been formed as shown in FIG. 6A is used as the conductive-surface substrate, electrical connection can not be performed in the rear surface, and thus, a device is needed for the cathode-side holder and the anode-side holder.

Figure 6B:
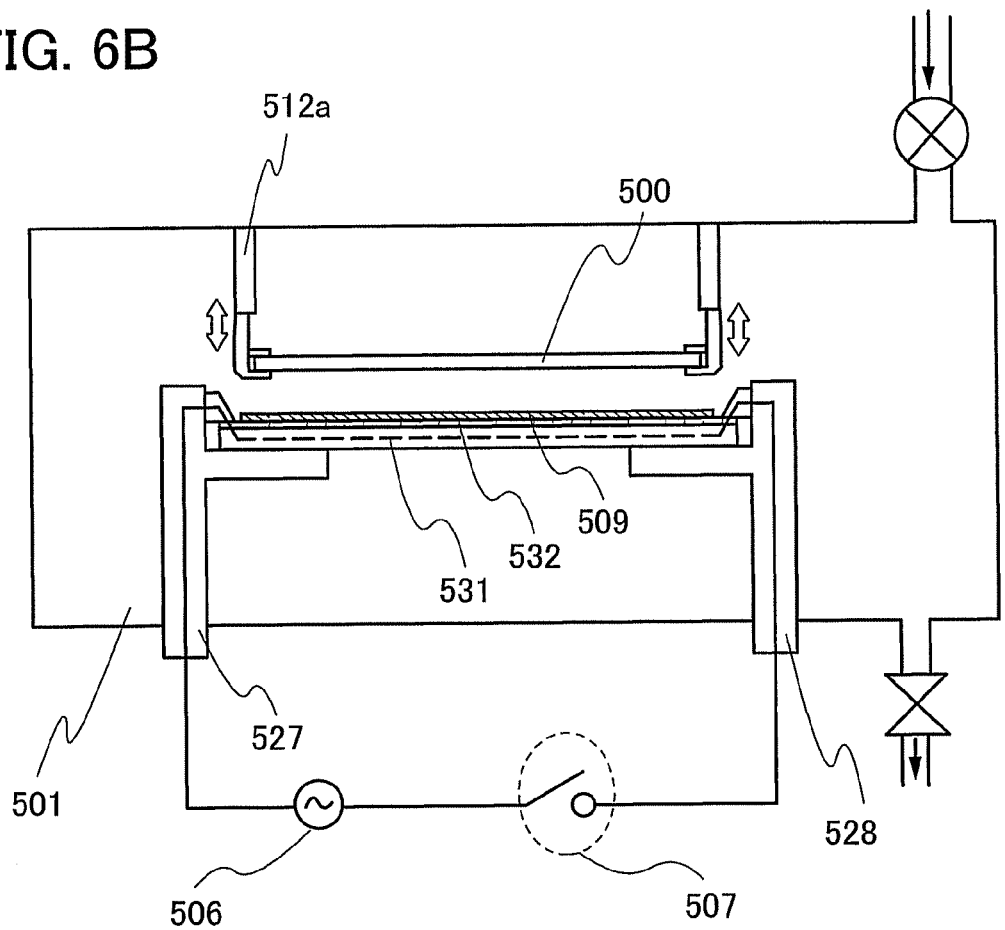

Thus, an example of a film formation apparatus in which a cathode-side holder and an anode-side holder which are different from those in FIG. 5 are used is shown in FIG. 6B. Note that the same symbols are used to denote the same components as FIG. 5.

A light-transmitting substrate 531 may be any substrate as long as the substrate can withstand a heat temperature of about 200° C. in film formation. A conductive film 532 with a thickness in the range of 100 nm to 0.1 nm both inclusive is formed by a sputtering method, a CVD method, or the like over the light-transmitting substrate 531. As shown in FIG. 6A, a material layer 509 is preferably removed only in the portion thereof which is in contact with the holders. For example, plasma treatment may be performed with a metal mask so that the material layer 509 only in the portion which is in contact with the holders is removed.

The light-transmitting substrate 531 provided with the material layer 509 is carried into the film formation chamber 501 and put on a cathode-side holder 527 and an anode-side holder 528. For each of the cathode-side holder 527 and the anode-side holder 528, an electrode for electrically connecting to the conductive film 532 is provided in addition to a fixing appliance.

Then, the switch 507 is turned on and a current is supplied from the power source 506 between the cathode-side holder 527 and the anode-side holder 528 so that the conductive film 532 is heated.

Note that the horizontal position and perpendicular position of the substrate 500 are adjusted by the alignment mechanism 512*a*. The alignment mechanism 512*a* can also adjust the distance between the substrate 500 and the light-transmitting substrate 531.

The thickness in the range of 100 nm to 0.1 nm both inclusive of the conductive film 532 is very preferable in that heating in a short period of time can be performed. Film formation can be completed enough even if the period of time in which the switch is on is about five seconds.

Note that, although the example in selective removal of the material layer in the peripheral edge of the substrate is performed is shown in FIG. 6A, the present invention is not limited to this. For example, instead of the selective removal of the material layer, a needle-like electrode may be provided for each of the cathode-side holder 527 and the anode-side holder 528 and a voltage may be applied to the needle-like electrode to pass through the material layer so that electrical connection to the conductive film is performed.

Further, in the case where material layers are formed over both surfaces of a metal substrate as described in Embodiment Mode 3, it is preferable that the needle-like electrode be pressed on either one of the substrates to pass a current through the material layer so that electrical connection to the metal substrate is performed.

Further, surface planarity of the conductive film which has been formed over the substrate was measured with an AFM (Atomic Force Microscope).

When the surface roughness of a rectangular tungsten plate with a thickness of 0.2 mm (5 inches in diagonal) was measured, a surface average roughness thereof per 100 square μm, Ra, was 39.09 nm.

Further, when the surface roughness of a glass substrate manufactured by Corning Incorporated (EAGLE 2000) over which a 1-μm tungsten film has been formed by a sputtering method was measured, the average surface roughness thereof per 100 square μm, Ra, was 9.239 nm.

Further, when the surface roughness of a quartz substrate (5 inches in diagonal) over which a 1-μm tungsten film has been formed by a sputtering method was measured, the average surface roughness thereof per 100 square μm, Ra, was 4.65 nm.

From these AFM results, it can be said that the surface planarity of the metal film which has been formed over the glass or quartz substrate is far superior to that of the metal plate. In addition, since the metal plate slightly expands with heating, it can be said that the quartz substrate which is less changed by heating is preferable in heat resistance and planarity.

Embodiment 2

In this embodiment, an example of manufacturing a passive matrix light-emitting device over a glass substrate is described using FIGS. 7A to 7C, 8, and 9.

In a passive matrix (simple matrix) light-emitting device, a plurality of anodes arranged in parallel and stripes (strip form) are provided perpendicularly to a plurality of cathodes arranged in parallel and stripes. A light-emitting layer or a fluorescent layer is interposed at each intersection between the anodes and the cathodes. Therefore, a pixel at an intersection of a selected anode (to which a voltage is applied) and a selected cathode emits light.

Figure 7A:
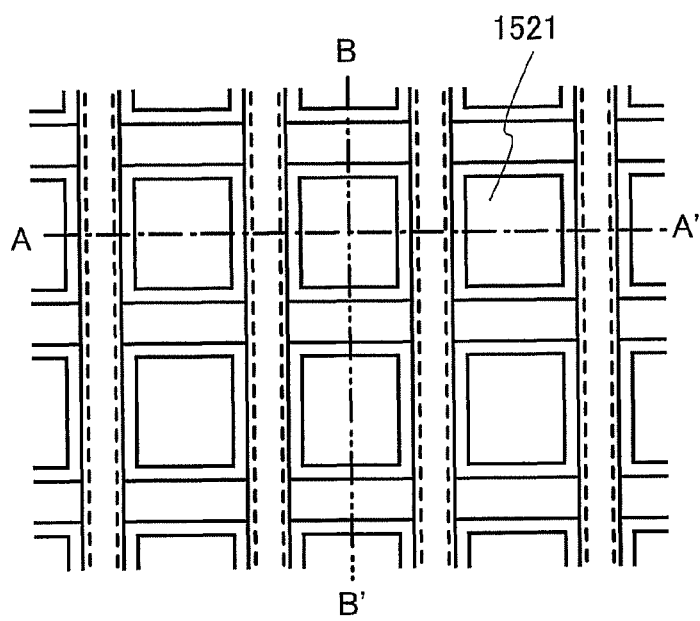
FIG. 7A is a top-plane view of a passive matrix light-emitting device and FIGS. 7B and 7C are cross-sectional views of the same.
Figure 7C:
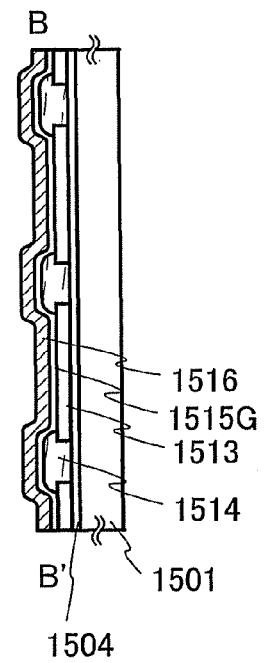
Figure 7B:
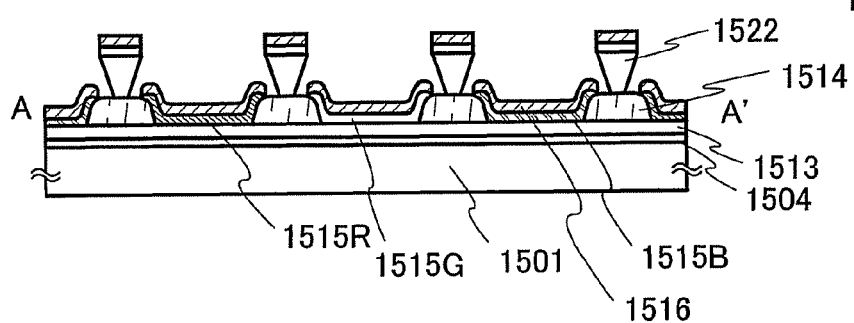

FIG. 7A is a top-plane view of a pixel portion before sealing. FIG. 7B is a cross-sectional view taken along a dashed line A-A' in FIG. 7A. FIG. 7C is a cross-sectional view taken along a dashed line B-B' in FIG. 7A.

An insulating film 1504 is formed over a first substrate 1501 as a base film. Note that the base film is not necessarily formed if not necessary. A plurality of first electrodes 1513 are arranged in stripes at constant intervals over the insulating film 1504. A bank 1514 having openings each corresponding to a pixel is provided over the first electrodes 1513. The bank 1514 having openings is formed of an insulating material (a photosensitive or nonphotosensitive organic material such as polyimide, acrylic, polyamide, polyimide amide, resist, or benzocyclobutene, or an SOG film such as a $SiO_x$ film containing an alkyl group). Note that the openings corresponding to the pixels become light-emitting regions 1521.

A plurality of inversely tapered banks 1522 which are parallel to each other and intersect with the first electrodes 1513 are provided over the banks 1514 having openings. The inversely tapered banks 1522 are formed by a photolithography method using a positive-type photosensitive resin by which a portion unexposed to light remains as a pattern, in which the amount of light exposure or the length of development time is adjusted so that a lower portion of the pattern is etched more.

Figure 8:
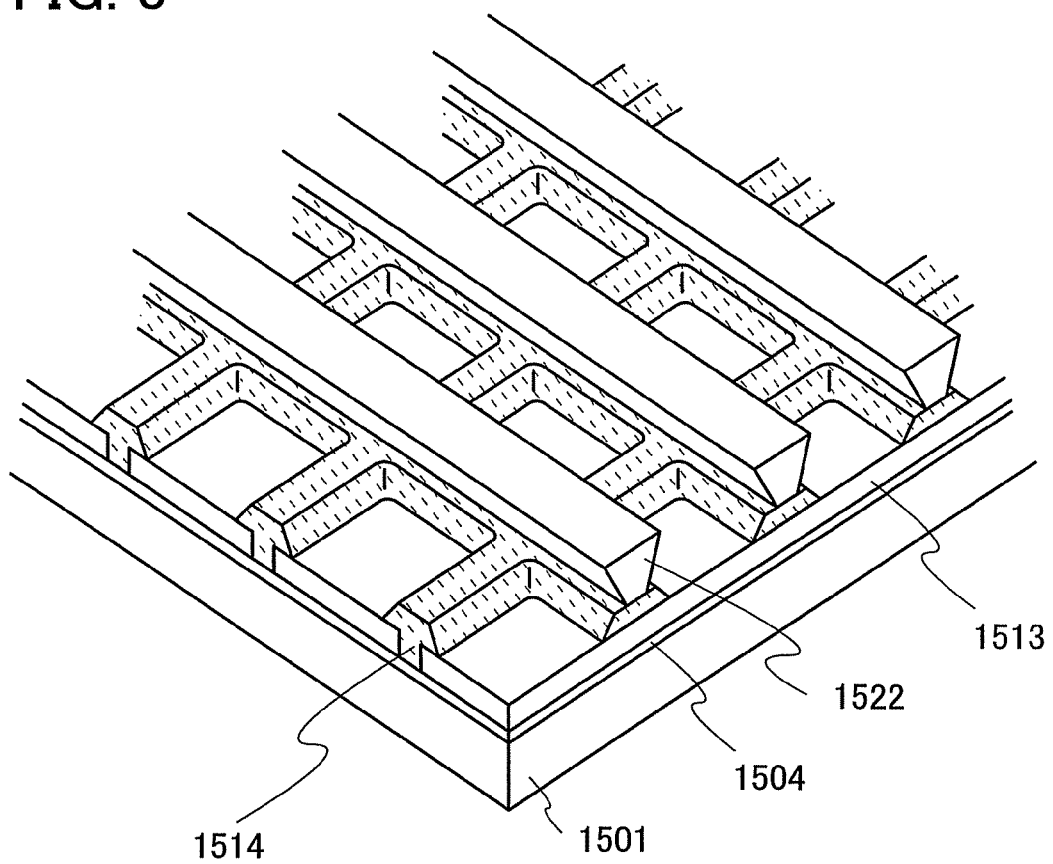
FIG. 8 is a perspective view of a passive matrix light-emitting device.

FIG. 8 is a perspective view immediately after formation of the plurality of inversely tapered banks 1522 which are parallel to each other. Note that the same reference numerals are used to denote the same portions as FIGS. 7A to 7C.

The thickness of each of the inversely tapered banks 1522 is set to be larger than the total thickness of a stacked-layer film including a light-emitting layer and a conductive film. By formation of the stack of the stacked-layer film including a light-emitting layer and the conductive film on a first substrate having the structure shown in FIG. 8, so that separation into a plurality of regions that are electrically isolated from each other is performed as shown in FIGS. 7A to 7C and stacked-layer films each including a light-emitting layer 1515R, 1515G, and 1515B, and second electrodes 1516 are formed. The second electrodes 1516 are electrodes arranged in stripe form that are parallel to each other and extend along a direction intersecting with the first electrodes 1513. Note that the stacked-layer film including a light-emitting layer and the conductive film are also formed over each of the inversely tapered banks 1522; however, they are electrically insulated from the stacked-layer films each including a light-emitting layer 1515R, 1515G, and 1515B and the second electrodes 1516.

In this embodiment, an example in which the stacked-layer films each including a light-emitting layer 1515R, 1515G, and 1515B are selectively formed to form a light-emitting device capable of full-color display, from which three kinds (R, G, and B) of light emission can be obtained is described. The stacked-layer films each including a light-emitting layer 1515R, 1515G, and 1515B are formed into stripes parallel to each other.

In this embodiment, the stacked-layer films each including a light-emitting layer are formed sequentially with the film formation chamber described in Embodiment 1. A first plate over which a red-light-emitting layer has been formed, a second plate over which a green-light-emitting layer has been formed, and a third plate over which a blue-light-emitting layer has been formed are prepared and carried into the second film formation chamber described in Embodiment 1.

Then, the substrate over which the first electrodes 1513 have been provided is also carried into the second film formation chamber. Then, a surface of the first plate is heated by a heat source with the same area as or a larger area than the substrate, that is, by a conductive-surface substrate which is heated by energization, whereby vapor deposition is performed. Subsequently, vapor deposition of the second plate and the third plate is performed as appropriate. The use of the film formation chamber described in Embodiment 1 can prevent evaporation entering around the mask, so that there can be no need of the inversely tapered banks 1522. Further, since the film thickness uniformity is excellent which is less than 6% with the film formation chamber, a light-emitting layer with a desired thickness can be obtained, whereby unevenness of color of a light-emitting device can be reduced. Therefore, the film formation chamber described in Embodiment 1 is useful as a manufacturing apparatus for a passive matrix light-emitting device.

Alternatively, a stacked-layer film including a light-emitting layer which emits light of the same color may be formed over the entire surface to provide single-color-light-emitting elements, so that a light-emitting device capable of performing monochromatic display or a light-emitting device capable of performing area color display may be provided. Further, a light-emitting device capable of performing full color display may be formed by combining color filters with a light-emitting device which provides white light emission as well.

Further, sealing is performed with a sealant such as a sealant can or a glass substrate for sealing if necessary. In this embodiment, a glass substrate is used as the second substrate, and the first substrate and the second substrate are attached to each other with an adhesive material such as a sealing material to seal a space surrounded by the adhesive material such as a sealing material. The space that is sealed is filled with filler or a dried inert gas. Furthermore, a space between the first substrate and the filler may be filled and sealed with a desiccant or the like in order to improve reliability of the light-emitting device. The desiccant removes a minute amount of moisture, thereby achieving sufficient desiccation. As the desiccant, a substance that adsorbs moisture by chemical adsorption such as oxide of alkaline earth metal such as calcium oxide or barium oxide can be used. Note that a substance that adsorbs moisture by physical adsorption such as zeolite or silicagel may be used as the desiccant as well.

However, if the sealant that covers and is in contact with the light-emitting element is provided to sufficiently block the outside air, the desiccant is not necessarily provided.

Figure 9:
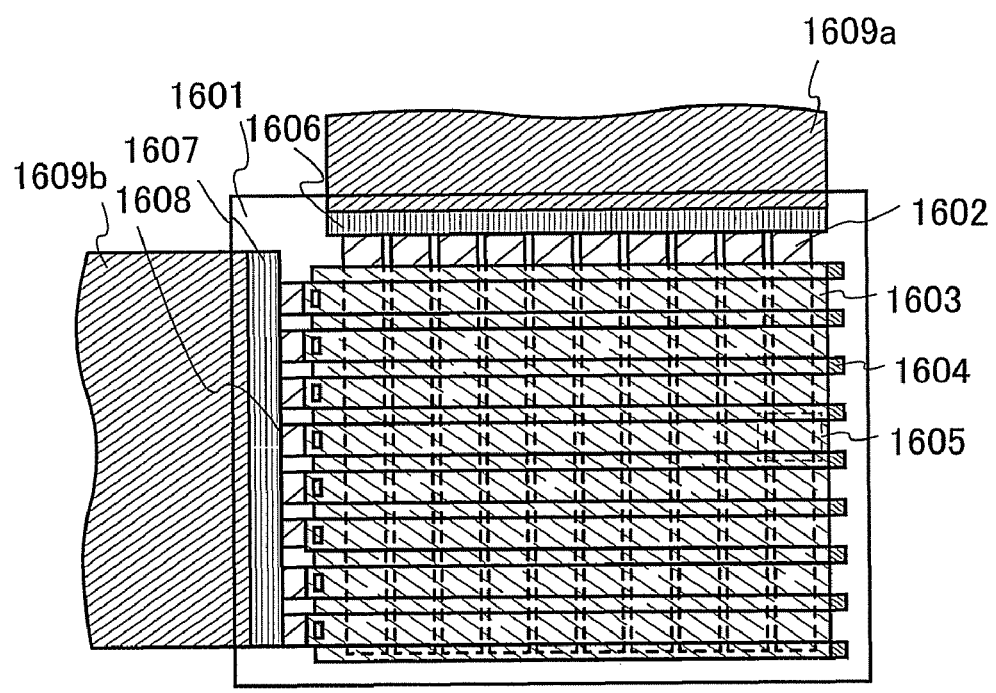
FIG. 9 is a top-plane view of a passive matrix light-emitting device.

Next, a top-plane view of a light-emitting module mounted with an FPC or the like is shown in FIG. 9.

Note that the light-emitting device in this specification refers to an image display device, a light emission device, or a light source (including a lighting device). Further, the light-emitting device includes the following modules in its category: a module in which a connector such as a flexible printed circuit (FPC), a tape automated bonding (TAB) tape, or a tape carrier package (TCP) has been attached to a light-emitting device; a module in which a printed wiring board has been provided at the end of a TAB tape or a TCP; and a module in which an integrated circuit (IC) has been directly mounted over a light-emitting device by a chip on glass (COG) method.

As shown in FIG. 9, in a pixel portion for displaying an image, scanning lines and data lines intersect with each other perpendicularly.

The first electrodes 1513 in FIGS. 7A to 7C correspond to scanning lines 1603 in FIG. 9, the second electrodes 1516 correspond to data lines 1602, and the inversely tapered banks 1522 correspond to banks 1604. A light-emitting layer is interposed between the data line 1602 and the scanning line 1603, and an intersection portion denoted by a region 1605 corresponds to one pixel.

Note that the scanning lines 1603 are electrically connected to connection wires 1608 at the ends thereof, and the connection wires 1608 are connected to an FPC 1609b via an input terminal 1607. The data lines 1602 are connected to an FPC 1609a via an input terminal 1606.

Further, if necessary, a polarizing plate, a circularly polarizing plate (including an elliptically polarizing plate), a retardation plate (a quarter-wave plate or a half-wave plate), or an optical film such as a color filter may be provided over a light exit surface as appropriate. Further, an anti-reflection film may be provided for the polarizing plate or the circularly polarizing plate. For example, anti-glare treatment may be carried out by which reflected light can be scattered by roughness of a surface so as to reduce reflection.

Through the above-described process, a flexible passive-matrix light-emitting device can be manufactured. When there can be no need of an inversely tapered bank with the film formation apparatus of the present invention, the element structure can be largely simplified and the period of time taken for the manufacturing process can be reduced.

Further, although the example in which a driver circuit is not provided over a substrate is shown in FIG. 9, an IC chip having a driver circuit may be mounted as described below.

In the case where the IC chip is mounted, a data line side IC and a scanning line side IC, in each of which a driver circuit for transmitting a signal to a pixel portion is formed, are mounted on the periphery of (outside) the pixel portion by a COG method. The mounting may be performed by a TCP or a wire bonding method other than the COG method as well. The TCP is a TAB tape mounted with an IC, and the TAB tape is connected to a wire over an element formation substrate so that the IC is mounted. Each of the data line side IC and the scanning line side IC may be formed using a silicon substrate, or may be formed by forming a driver circuit of a TFT over a glass substrate, a quartz substrate, or a plastic substrate. Further, although the example in which one IC is provided on one side is described in this embodiment, a plurality of ICs which have been divided from each other may be provided on one side as well.

Embodiment 3

In this embodiment, a light-emitting device formed with the film formation apparatus of the present invention is described using FIGS. 10A and 10B. Note that FIG. 10A is a top-plane view showing the light-emitting device and FIG. 10B is a cross-sectional view taken along a line A-A' in FIG. 10A. Reference numeral 1701 indicated by a dotted line denotes a driver circuit portion (a source side driver circuit); 1702 denotes a pixel portion; 1703 denotes a driver circuit portion (a gate side driver circuit); 1704 denotes a sealing substrate; 1705 denotes a sealant; and 1707 which is interspace surrounded by the sealant 1705 denotes a space.

Reference numeral 1708 denotes a wire for transmitting signals input to the source side driver circuit 1701 and the gate side driver circuit 1703, and the wire 1708 receives a video signal, a clock signal, a start signal, a reset signal, and the like from a flexible printed circuit (FPC) 1709 which is an external input terminal. Note that, although only the FPC is shown, a printed wiring board (PWB) may be attached to the FPC. The light-emitting device in this specification includes, in its category, not only the light-emitting device itself but also the light-emitting device provided with an FPC and/or a PWB.

Next, a cross-sectional structure thereof is described using FIG. 10B. A driver circuit portion and a pixel portion are formed over an element substrate 1710; the source side driver circuit 1701 that is one driver circuit portion and the pixel portion 1702 are shown in FIG. 10B.

Note that, for the source side driver circuit 1701, a CMOS circuit in which an n-channel TFT 1723 and a p-channel TFT 1724 are combined is formed. Further, a circuit included in the driver circuit may be a known CMOS circuit, PMOS circuit, or NMOS circuit. Further, although a driver-integrated type in which a driver circuit is formed over a substrate is described in this embodiment, the present invention is not limited to this type and a driver circuit may be formed not over a substrate but outside the substrate as well.

Further, the pixel portion 1702 is formed of a plurality of pixels each including a switching TFT 1711, a current control TFT 1712, and an anode 1713 that is electrically connected to a drain of the current control TFT 1712. An insulator 1714 is formed so as to cover an edge of the anode 1713. In this embodiment, the insulator 1714 is formed of a positive type photosensitive acrylic resin film.

Further, the insulator 1714 is formed so as to have a curved surface having curvature at an upper or lower edge portion thereof in order to provide favorable film coverage. For example, in the case where a positive type photosensitive acrylic is used as a material for the insulator 1714, the upper edge portion of the insulator 1714 has preferably a curved surface having a radius of curvature (0.2 to 3 μm). Further, for the insulator 1714, either a negative type that becomes insoluble in an etchant by photosensitive light or a positive type that becomes soluble in an etchant by light can be used, and an inorganic compound such as silicon oxide or silicon oxynitride can be used as well as an organic compound.

A layer containing an organic material 1700 and a cathode 1716 are formed over the anode 1713. Here, as a material used for the anode 1713, a material having a high work function is preferable. For example, as well as a single layer film of an indium tin oxide (ITO) film, an indium tin silicon oxide (ITSO) film, an indium zinc oxide (IZO) film, a titanium nitride film, a chromium film, a tungsten film, a Zn film, a Pt film, or the like, a stacked layer of a titanium nitride film and a film containing aluminum as the main component, or a three-layer structure of a titanium nitride film, a film containing aluminum as the main component, and a titanium nitride film can be used. Further, in the case where the anode 1713 is formed of an ITO film and a wire of the current control TFT 1712, which connects to the anode 1713, is formed of a stacked layer of a titanium nitride film and a film containing aluminum as the main component or a stacked layer of a titanium nitride film, a film containing aluminum as the main component, and a titanium nitride film, the resistance as a wire can be low, good ohmic contact with the ITO film can be obtained, and the anode 1713 can be functioned as an anode. Further, the anode 1713 may be formed of the same substance as a first anode of a light-emitting element 1715, or the anode 1713 may be stacked to be in contact with the first anode of the light-emitting element 1715.

Further, the light-emitting element 1715 has a structure in which the anode 1713, the layer containing an organic material 1700, and the cathode 1716 are stacked; specifically, a hole injection layer, a hole transport layer, a light-emitting layer, an electron transport layer, an electron injection layer, and/or the like are stacked as appropriate. Film formation may be performed with the film formation apparatus described in any one of Embodiment Modes 1 and 3. In this embodiment, the manufacturing apparatus described in Embodiment 1 is used. Further, since the film thickness uniformity is excellent which is less than 6% with the manufacturing apparatus described in Embodiment 1, a desired film thickness can be obtained, whereby luminance variations in a light-emitting device can be reduced.

As a material used for the cathode 1716, a material having a low work function (Al, Ag, Li, or Ca, an alloy thereof such as MgAg, MgIn, AlLi, or $CaF_2$, or calcium nitride) is preferable; however, the present invention is not limited to this, and various conductive films can be applied by appropriate selection of an electron injection material. Note that, in the case where light from the light-emitting element 1715 is transmitted through the cathode 1716, a stacked layer of a thin metal film with a small thickness and a transparent conductive film (e.g., a film of oxide indium-tin oxide (ITO), indium tin silicon oxide (ITSO), indium oxide-zinc oxide ($In_2O_3$—ZnO), or zinc oxide (ZnO)) may be used. Further, the cathode 1716 may be formed of the same substance as a second cathode of the light-emitting element 1715, or the cathode 1716 may be stacked to be in contact with the second cathode of the light-emitting element 1715.

Furthermore, the structure in which the light-emitting element 1715 is provided in the space 1707 surrounded by the element substrate 1710, the sealing substrate 1704, and the sealant 1705 is obtained by attaching the sealing substrate 1704 to the element substrate 1710 with the sealant 1705. Note that the space 1707 may be filled with the sealant 1705 as well as an inert gas (e.g., nitrogen or argon).

Note that an epoxy-based resin is preferably used for the sealant 1705. In addition, it is preferable that such a material do not transmit moisture or oxygen as much as possible. Further, as a material used for the sealing substrate 1704, a plastic substrate made of fiberglass-reinforced plastics (FRP), polyvinyl fluoride (PVF), polyester, acrylic, or the like can be used as well as a glass substrate or a quartz substrate.

Through the above, the light-emitting device including a light-emitting element of the present invention can be obtained. Manufacturing cost per substrate tends to increase in the case of an active matrix light-emitting device because of manufacture of a TFT; however, by using a large-area substrate with the manufacturing apparatus of the present invention described in Embodiment 1, film formation process time per substrate can be largely shortened so that a large reduction of cost for each light-emitting device can be achieved. Therefore, the manufacturing apparatus of the present invention described in Embodiment 1 is useful as a manufacturing apparatus for an active matrix light-emitting device.

Note that the light-emitting device described in this embodiment can be implemented freely combining with any of Embodiment Mode 1, the film formation apparatus described in Embodiment Mode 3, and the film formation method described in Embodiment Mode 2. Further, in the light-emitting device described in this embodiment, a chromaticity conversion film such as a color filter may be used as needed.

Embodiment 4

In this embodiment, explanation is made using FIGS. 11A to 11E on various electronic appliances manufactured using a light-emitting device including a light-emitting element manufactured with the manufacturing apparatus of the present invention.

Examples of the electronic appliances manufactured using the film formation apparatus of the present invention include: televisions, cameras such as video cameras or digital cameras, goggle displays (head mount displays), navigation systems, audio reproducing devices (e.g., car audio component stereos and audio component stereos), notebook personal computers, game machines, portable information terminals (e.g., mobile computers, mobile phones, portable game machines, and electronic books), and image reproducing devices provided with recording media (specifically, devices that can reproduce a recording medium such as a digital versatile disc (DVD) and is provided with a display device capable of displaying the reproduced images), lighting appliances, and the like. Specific examples of these electronic appliances are illustrated in FIGS. 11A to 11E.

Figure 11A:
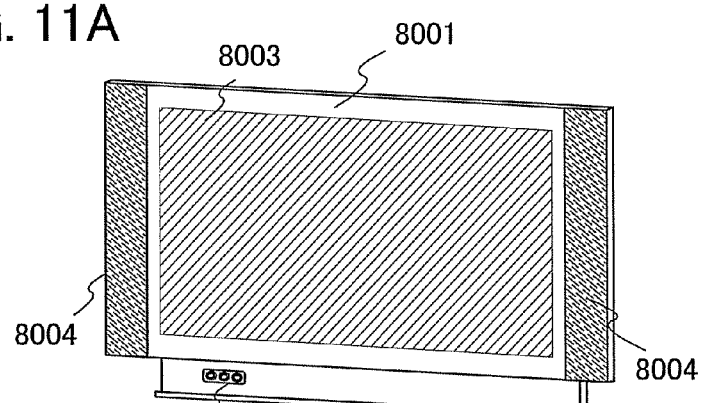
FIGS. 11A to 11E are diagrams illustrating examples of electronic appliances.

FIG. 11A illustrates a display device including a chassis 8001, a supporting base 8002, a display portion 8003, a speaker portion 8004, a video input terminal 8005, and the like. The display device is manufactured by using a light-emitting device manufactured using the present invention for the display portion 8003. Note that the display device includes in its category any device for displaying information, for example, for a personal computer, for receiving TV broadcasting, or for displaying an advertisement. The manufacturing apparatus of the present invention enables large reduction of manufacturing cost so that an inexpensive display device can be provided. Further, since the film thickness uniformity is excellent which is less than 6% with the film formation apparatus of the present invention, a desired film thickness can be obtained, whereby display variations on the display portion 8003 can be reduced.

Figure 11B:
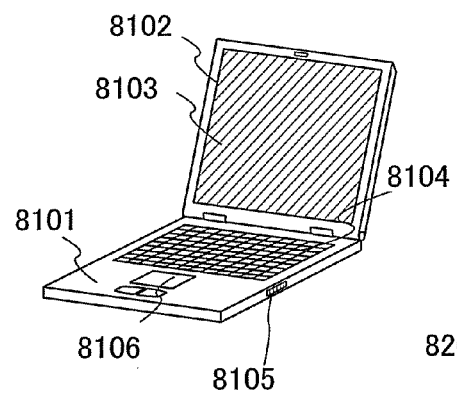

FIG. 11B illustrates a notebook personal computer including a main body 8101, a chassis 8102, a display portion 8103, a keyboard 8104, an external connection port 8105, a pointing device 8106, and the like. The notebook personal computer is manufactured by using, for the display portion 8103, a light-emitting device including a light-emitting element formed with the film formation apparatus of the present invention. The manufacturing apparatus of the present invention enables large reduction of manufacturing cost so that an inexpensive notebook personal computer can be provided. Further, since the film thickness uniformity is excellent which is less than 6% with the film formation apparatus of the present invention, a desired film thickness can be obtained, whereby display variations on the display portion 8103 can be reduced.

Figure 11C:
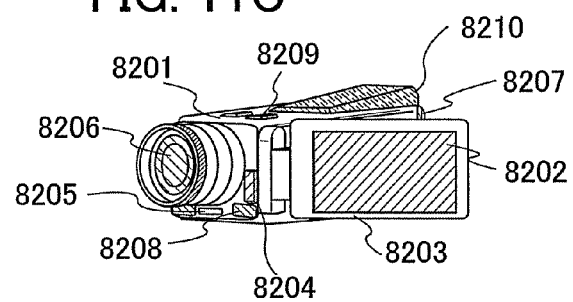

FIG. 11C illustrates a video camera including a main body 8201, a display portion 8202, a chassis 8203, an external connection port 8204, a remote control receiving portion 8205, an image receiving portion 8206, a battery 8207, an audio input portion 8208, operation keys 8209, an eyepiece portion 8210, and the like. The video camera is manufactured by using, for the display portion 8202, a light-emitting device including a light-emitting element formed with the film formation apparatus of the present invention. The manufacturing apparatus of the present invention enables large reduction of manufacturing cost so that an inexpensive video camera can be provided. Further, since the film thickness uniformity is excellent which is less than 6% with the film formation apparatus of the present invention, a desired film thickness can be obtained, whereby display variations on the display portion 8202 can be reduced.

Figure 11D:
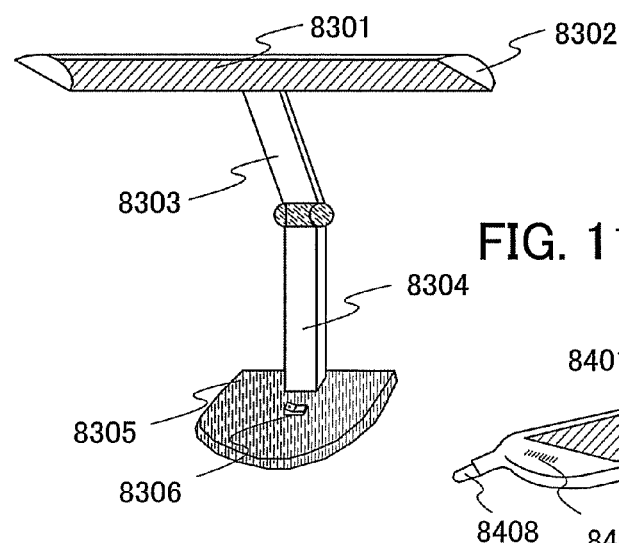

FIG. 11D illustrates a desktop lighting appliance including a lighting portion 8301, a shade 8302, an adjustable arm 8303, a support 8304, a base 8305, and a power source 8306. The desk lighting appliance is manufactured by using, for the lighting portion 8301, a light-emitting device formed with the film formation apparatus of the present invention. Note that the lighting appliance includes, in its category, a ceiling-fixed lighting appliance, a wall-hanging lighting appliance, and the like. The manufacturing apparatus of the present invention enables large reduction of manufacturing cost so that an inexpensive desktop lighting appliance can be provided. Further, since the film thickness uniformity is excellent which is less than 6% with the film formation apparatus of the present invention, a desired film thickness can be obtained, whereby display variations on the light-emitting device can be reduced.

Figure 11E:
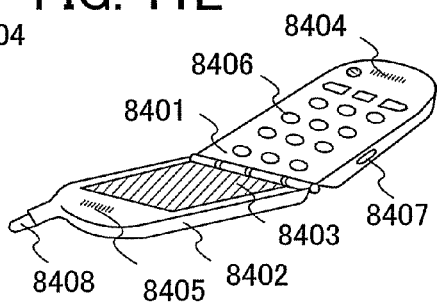

FIG. 11E illustrates a mobile phone including a main body 8401, a chassis 8402, a display portion 8403, an audio input portion 8404, an audio output portion 8405, operation keys 8406, an external connection port 8407, an antenna 8408, and the like. The mobile phone is manufactured by using, for the display portion 8403, a light-emitting device including a light-emitting element formed with the film formation apparatus of the present invention. The manufacturing apparatus of the present invention enables large reduction of manufacturing cost so that an inexpensive mobile phone can be provided. Further, since the film thickness uniformity is excellent which is less than 6% with the film formation apparatus of the present invention, a desired film thickness can be obtained, whereby display variations on the display portion 8403 can be reduced.

As described above, an electronic appliance or a lighting appliance using a light-emitting element formed with the film formation apparatus of present invention can be obtained. The applicable range of a light-emitting device including a light-emitting element formed with the film formation apparatus of the present invention is so wide that the light-emitting device can be applied to electronic appliances in various fields.

Note that the light-emitting device described in this embodiment can be implemented freely combining with any of Embodiment Mode 1, the film formation apparatus described in Embodiment Mode 3, and the film formation method described in Embodiment Mode 2. Furthermore, the light-emitting device described in this embodiment can be implemented freely combining with any one of Embodiments 1 to 3.

This application is based on Japanese Patent Application Serial No. 2007075375 filed with Japan Patent Office on Mar. 22, 2007, the entire contents of which are hereby incorporated by reference.

What is claimed is:

1. A method for manufacturing a light-emitting device, comprising:
    forming a first organic layer comprising an organic material over a first substrate having a conductive surface;
    disposing a second substrate providing with a first electrode in such a manner that the first electrode is opposed to the first substrate;
    heating the first organic layer by applying an electric current to the conductive surface to evaporate the organic material of the first organic layer, thereby, forming a second organic layer on the first electrode; and
    forming a second electrode over the second organic layer, wherein the conductive surface has the surface average roughness Ra is less than 50 nm.

2. The method for manufacturing a light-emitting device, according to claim 1, wherein a mask having an opening is disposed between the first substrate so that the second organic layer is formed selectively on the surface of the second substrate.

3. The method for manufacturing a light-emitting device, according to claim 1, wherein a distance between a conductive surface of the first substrate and the surface of the second substrate is in the range of 0.5 mm to 30 mm both inclusive.

4. The method for manufacturing a light-emitting device, according to claim 1, wherein the second organic layer contains the same material as the first organic layer.

5. The method for manufacturing a light-emitting device, according to claim 1, wherein the first substrate is a substrate made from a conductive material, a semiconductor substrate on which a conductive film is formed, or an insulating substrate on which a conductive film is formed.

6. The film formation method, according to claim 1, wherein the first substrate is rectangular and an area of the first substrate larger than an area of the second substrate.

7. The method for manufacturing a light-emitting device, according to claim 1, wherein the conductive surface has the surface average roughness Ra is in the range of 20 nm to 40 nm both inclusive.

8. The method for manufacturing a light-emitting device, according to claim 1, wherein the first substrate has the surface average roughness Ra is in the range of 1 nm to 10 nm both inclusive.

9. A film formation method, comprising:
forming a first organic layer comprising a first organic material over a first surface of a first substrate having a conductive surface;
forming a second organic layer comprising a second organic material over a second surface of the first substrate;
disposing a second substrate and a third substrate so as to face each other with the first substrate interposed therebetween; and
heating the first organic layer by applying an electric current to the conductive surface to evaporate the first organic material of the first organic layer and the second organic material of the second organic layer, thereby, forming a third organic layer on the second substrate and a fourth organic layer on the third substrate,
wherein the conductive surface has the surface average roughness Ra is less than 50 nm.

10. The film formation method, according to claim 9, wherein the third organic layer formed contains the same material as the first organic layer and the fourth organic layer contains the same material as the second organic layer.

11. The film formation method, according to claim 9, wherein a distance between a conductive surface of the first substrate and the surface of the second substrate is in the range of 0.5 mm to 30 mm both inclusive.

12. The film formation method, according to claim 9, wherein a distance between the conductive surface of the first substrate and the surface of the third substrate is in the range of 0.5 mm to 30 mm both inclusive.

13. The film formation method, according to claim 9, wherein the first substrate is a glass substrate or a quartz substrate on which a flat conductive film is formed.

14. The film formation method, according to claim 9, wherein the first substrate is a metal substrate having a flat surface.

15. The film formation method, according to claim 9, wherein the first substrate is rectangular and an area of the first substrate larger than an area of the second substrate.

16. The method for manufacturing a light-emitting device, according to claim 9, wherein the conductive surface has the surface average roughness Ra is in the range of 20 nm to 40 nm both inclusive.

17. The method for manufacturing a light-emitting device, according to claim 9, wherein the first substrate has the surface average roughness Ra is in the range of 1 nm to 10 nm both inclusive.

* * * * *